United States Patent [19]
Stein et al.

[11] Patent Number: 5,153,466
[45] Date of Patent: Oct. 6, 1992

[54] ALL MONOLITHIC TRANSCEIVER OPERATIVE FROM A LOW VOLTAGE VCC DC SUPPLY

[75] Inventors: Marc T. Stein, Torija Mission Viejo, Calif.; Lonny E. Stormo, Chandler, Ariz.

[73] Assignee: Medtronic, Inc., Minneapolis, Minn.

[21] Appl. No.: 675,399

[22] Filed: Mar. 26, 1991

[51] Int. Cl.$^5$ .......................................... H03K 19/092
[52] U.S. Cl. .................................. 307/475; 307/454; 307/296.6; 307/480; 455/63; 375/26
[58] Field of Search ............... 307/475, 454, 455, 456, 307/520, 290, 296.6, 480; 364/238.6, 238.9; 455/24, 63, 73, 74, 90, 127, 128, 296, 54, 343, 38; 340/825.5, 825.44; 370/95.2; 375/60, 76

[56] References Cited

U.S. PATENT DOCUMENTS

| | | | |
|---|---|---|---|
| 4,614,882 | 9/1986 | Parker et al. | 307/475 X |
| 4,955,075 | 9/1990 | Anderson | 455/343 X |
| 4,955,080 | 9/1990 | Wagai et al. | 455/343 |
| 4,967,108 | 10/1990 | Lee et al. | 307/520 |
| 4,984,291 | 1/1991 | Dias et al. | 455/54 X |
| 4,989,261 | 1/1991 | Lee | 455/125 |
| 5,014,343 | 5/1991 | Place | 455/38 |

Primary Examiner—David Hudspeth
Attorney, Agent, or Firm—John A. Rissman; Harold R. Patton

[57] ABSTRACT

A new and improved all monolithic transceiver manufactured on a single semiconductor die and operative from a 5 volt DC power supply. The transceiver meets all of the pulse width and timing requirements of the MIL-STD-1553 transceiver and is operative at high switching speeds and high output current levels to generate bi-phase TX OUT and $\overline{\text{TX OUT}}$ signals used to drive, respectively, two center tapped primary windings of an output transformer. The transmitter includes two dynamically driven data channels which are driven out of phase and in a controlled manner that ensures that one data channel has been completely turned off before the other data channel turns on, thereby maximizing power transfer and operating efficiency while minimizing unnecessary current drain and eliminating current spiking in the output of the transmitter. The receiver of the transceiver includes a differential amplifier connected to drive first a balanced differential filter and then a differential window comparator which establish the bandwidth, voltage thresholds, gain-versus-frequency characteristic and Q point of the transceiver. Advantageously, the above all monolithic construction is facilitated by the use of MOS capacitor technology and by the use of chrome-silicon alloy technology to form, respectively, thin film capacitors and resistors on the surface of the monolithic die and used in the construction of resistor-capacitor filter networks, bias and load resistors and the like. The above differential window comparator is connected to a pair of output logic drivers to generate therefrom TX DATA OUT and $\overline{\text{RX DATA OUT}}$ bi-phase output signals for use in controlling an associated computer.

38 Claims, 9 Drawing Sheets

ALL MONOLITHIC TRANSCEIVER OPERATIVE FROM A LOW VOLTAGE VCC DC SUPPLY

TECHNICAL FIELD

This invention relates generally to solid state transceivers (integrated transmitters and receivers) for processing digital and analog information between two or more computers. More particularly, this invention relates to a monolithic transceiver wherein all transceiver components are fabricated on a single monolithic semiconductor die, thereby eliminating any requirement for hybrid circuit interconnections and related hybrid assembly fabrication processes.

BACKGROUND ART

In many fields of communication between two or more computers such as those used in military avionics, tanks, howitzer systems and the like wherein digital and analog information must be processed between computers, it has been a common practice to drive the inputs of a transmitter section of one transceiver with digital data which is then appropriately processed in the transmitter and used in turn to drive an output transformer. This output transformer may be connected in one of several available transformer configurations, and the output transformer is in turn connected to a standard bus line and data link and is operative to convert the digital data to an analog voltage of a specified wave shape, waveform timing and power level. These later parameters must be sufficient to properly transmit the analog data from the transceiver over the bus line and to a similar transceiver located at a remote computer within the particular communication system.

For example, in certain military aircraft avionics systems, there might be one such computer in the aircraft cockpit to provide pilot information from another remotely located computer operative for providing various aircraft operational parameters such as speed, direction, fuel levels, temperatures, wind velocities and the like. These two physically separated computers would therefore each be equipped with one or more transceivers which are connected over relatively short data bus links typically on the order of 300 feet or less.

In the past, it has been a common practice to use several hybrid connections in the fabrication of a transceiver of the type described above. This practice required that a common insulating substrate such as a ceramic material be used to support and provide electrical interconnections between various components on the substrates such as one or more integrated circuit die, discrete capacitors, thin film resistors, and the like. The requirement for these hybrid circuit interconnections and associated fabrication assembly processes had the disadvantage of providing the additional space required to accommodate the substrate size, and more importantly the disadvantage of increased production costs and decreased device reliability associated with these hybrid fabrication and interconnection processes.

Another common practice used in the fabrication of these prior art transceivers was to provide a 15 volt DC power supply in order to minimize the current drive levels necessary for properly driving the output transformer of the transmitter section of the transceiver at the above specified wave shapes, waveform timing, and analog signal power levels on the bus lines to which the transformer was connected. The disadvantage of using this relatively high level DC voltage supply of 15 volts is that a separate 15 volt supply voltage is required in addition to the standard 5 volt Vcc voltage used for powering the standard monolithic integrated circuits which are already contained in a sub-system. This requirement in turn added cost to the sub-system and has been generally objectionable to system and sub-system designers.

More particularly, for certain transceiver applications such as the military standard 1553 (MIL-STD-1553) avionics bus line for interconnecting computers, it has been specified by some sub-system manufacturers that the transceiver must operate off of a 5 volt DC power supply. This requirement has made the task of bringing all of the components heretofore constructed in hybrid form into a single monolithic die extremely difficult. Furthermore, the requirement for using a single 5 volt Vcc supply voltage in turn means that parts of the monolithic die must be driven below ground (i.e. the silicon substrate potential) in order to produce the necessary transformer output current drive waveforms for the transmitter section of the transceiver. This latter mode of operation was not heretofore required when using 15 volt DC voltage supplies. This latter requirement for driving the silicon substrate below ground in turn introduces a myriad of problems into the transistor switching process used in the transceiver.

As one example, using a 15 volt DC supply with a grounded substrate, it was hitherto a common and preferable practice to use complementary driven high speed NPN driver transistors and vertical PNP transistors to provide the high speed signal processing and transformer switching action for the transceiver. However, when one is limited to using a single 5 volt Vcc DC supply, there has been much skepticism among those skilled in the art that the required timing, speed, and power output and impedance requirements for the MIL-STD-1553 data bus could be maintained with an all monolithic transceiver, particularly since vertical PNP transistors and output NPN transistor drivers frequently cannot be properly maintained in their "off" state when driven below substrate potential. This characteristic would therefore require the use of an NPN output transistor with a PNP driver transistor. If a vertical PNP transistor is not available, a lateral PNP transistor needs to be used as the driver transistor, and these lateral PNP transistors were not believed to be capable of maintaining the above required timing, speed and power requirements for the MIL-STD-1553 avionics system transceivers.

DISCLOSURE OF INVENTION

Accordingly, the general purpose and principal object of this invention is to provide a new and improved all-monolithic integrated circuit transceiver which eliminates the need for any of the above described hybrid circuit interconnections and their associated disadvantages. Simultaneously, we have also eliminated the requirement for a 5 volt DC power supply in order to provide the required transmitter/transformer voltage and current drive, wave shape, timing, and power levels at the MIL-STD-1553 data bus line which interconnects two computers.

Another object of this invention is to provide a new and improved transceiver of the type described which may be manufactured at a significantly reduced cost relative to that of any known transceivers on the market.

Another object of this invention is to provide a new and improved transceiver of the type described whose mean time between failure (MTBF) has been increased by about five times that of known existing transceivers, thereby substantially improving the reliability of the communication systems in which these transceivers are used.

Another object of this invention is to provide a new and improved transceiver of the type described whose receiver filtering characteristics exceed the noise immunity requirements of the MIL-STD-1553 system.

Another object of this invention is to provide a new and improved transceiver of the type described which has a relatively low standby power dissipation and in addition has a lower power consumption than that of presently available competitive transceivers.

Another object of this invention is to provide a new and improved transceiver of the type described which may be constructed in either flatpack, plug-in or custom ceramic packaging.

Another object of this invention is to provide a new and improved transceiver of the type described wherein two electrically isolated integrated circuits may be provided conveniently in a single package for dual redundancy, with both integrated circuits being operative from a single 5 volt power supply.

To accomplish the above purpose and the various related objects stated above, there is provided in accordance with the present invention the unique and novel construction on a single integrated circuit die of a number of specifically defined monolithic integrated circuits and associated resistors. These circuits are described further below as independent and novel features within the overall transceiver system. These integrated circuits operate to provide specific and independent signal processing functions and are interconnected in such a manner as to allow these circuits and components to generate the correct waveshape and necessary levels of signal transmission at the output transformer of the transceiver's transmitter section. These circuits also operate to provide the appropriate receiver filter and signal detection/discrimination characteristics. In addition, in order to eliminate all previously required hybrid circuit interconnections, chrome-silicon alloy resistors and metal-oxide-silicon (MOS) capacitors are formed using state-of-the-art MOS and Cr—Si technologies on top of the monolithic integrated circuit chip.

In accordance with a system embodiment of the present invention, there is provided a receiver section of the transceiver having an input differential amplifier stage connected to drive a balanced differential filter. A differential window comparator is connected to the output of the balanced differential filter, and the window comparator is in turn connected through a level translating and strobe cell stage to a pair of output channels preferably connected in transistor-transistor-logic (TTL) or complementary MOS (CMOS) output logic configuration.

In the transmitter section of the transceiver, there is provided an input logic stage for receiving bi-phase digital input data, and this input logic stage has its output connected through a logic and waveshape interface stage to first and second wave shaping channels. The first and second wave shaping channels are operative to provide bi-phase timing signals at their outputs, and these timing signals are connected through a pair of output transistor drivers and to a center tapped transformer. The two primary windings of the center tapped transformer are connected across the outputs of these two output drivers, and the center tap of the primary winding is connected to ground potential. The secondary winding of this output transformer may be connected either through transformer coupling or direct coupling to each side of a data bus line which is interconnected to another like transceiver at a remote computer. The above input logic stage wave shaping channels and output transistor driver stages operate in such a manner as to ensure that one transformer primary winding is completely turned off before the other primary winding turns on.

A novel feature of this invention used in the construction of this transceiver is the provision of the required filter circuits on top of the monolithic IC chip and using a combination of MOS capacitors and chrome-silicon alloy resistors to form the desired RC filter networks.

Another novel feature of this invention utilized in the transmitter section of the transceiver is the provision of an efficient low power 5 volt monolithic MIL-STD 1553 transmitter operative with two parallel connected signal processing channels to ensure that one channel is always turned off when the other channel is turned on. (Micro-Rel Inc. Disclosure No. P-2121).

Another novel feature of this invention in the transmitter section of the transceiver is the provision of new and improved wave shaping circuitry in each of two transmitter channels which employs unique current drive and feedback circuitry operative to force a high current lateral PNP driver transistor to turn off and on quickly, thereby maximizing circuit speed. (Micro-Rel Inc. Disclosure No. P-2120).

Another novel feature of this invention in the transmitter section of the transceiver is the provision of a high impedance off state for a 5 volt monolithic MIL-STD 1553 transceiver which is operative to ensure that one-half ($\frac{1}{2}$) of the above described center tapped transformer primary winding is completely non-conductive and turned off when the other half of the primary winding is conducting and turned on. This feature provides for the most efficient energy transfer from the primary winding of the output transformer and to the data bus line and without any current spiking in the output transformer. This feature further enhances the power transfer efficiency of the transceiver and thereby minimizes extraneous power dissipation in the transmitter circuitry thereof. In addition, the MIL-STD-1553 transceiver requires that the transmitter of the transceiver provide a high impedance even when it is not transmitting, and the impedance characteristics of the present transceiver surpass this requirement. (Micro-Rel Inc. Disclosure No. P-2123) .

Another novel feature of this invention in the transmitter section of the transceiver is the provision of sync pulse timing pulse and wave shape interface circuitry which is connected between the logic stage input of the transmitter section and both of the wave shaping stages therein and incorporates standby power conservation means. This sync pulse and timing pulse circuitry is operative to ensure that the timing of the first output pulse from the transmitter is well within the pulse width and timing limits specified by the MIL-STD-1553 transceiver requirements. Furthermore, this timing circuitry provides a means for insuring the proper pulse timing on the very first pulse (sync pulse) in any given transmission. (Micro-Rel Inc. Disclosure No. P-2125).

Another novel feature of this invention in the receiver section of the transceiver is the provision of an input DC coupled differential input/differential output stage which is connected through a balanced differential filter to an integrated window comparator. This integrated circuitry on a single semiconductor die incorporates the input preamplifier stage, the subsequent balanced differential filter stage and the following window comparator stage in the herein described and claimed novel system organization of the invention. (Micro-Rel Inc. Disclosure No. P-2122).

Another novel feature of this invention in the receiver section of the transceiver is the provision of a high speed and efficient transistor-transistor-logic (TTL) output stage with integrated DC level translation to an analog comparator output and fabricated utilizing a conventional bipolar fabrication process. This novel feature incorporates the DC level translation, a strobe cell stage and the parallel connected transistor-transistor-logic output stages in the novel receiver system organization of this invention. (Micro-Rel Inc. Disclosure No. P-2124).

The above brief summary of the invention, together with its various objects, features and many unique advantages will become more readily apparent in the following description of the accompanying drawings.

BRIEF DESCRIPTION OF THE DRAWINGS

FIG. 9 features a high speed and efficient TTL output stage with integrated DC level translation to an analog comparator output and produced using a conventional bipolar fabrication process.

DETAILED DESCRIPTION OF THE PREFERRED EMBODIMENTS

Figure 1:
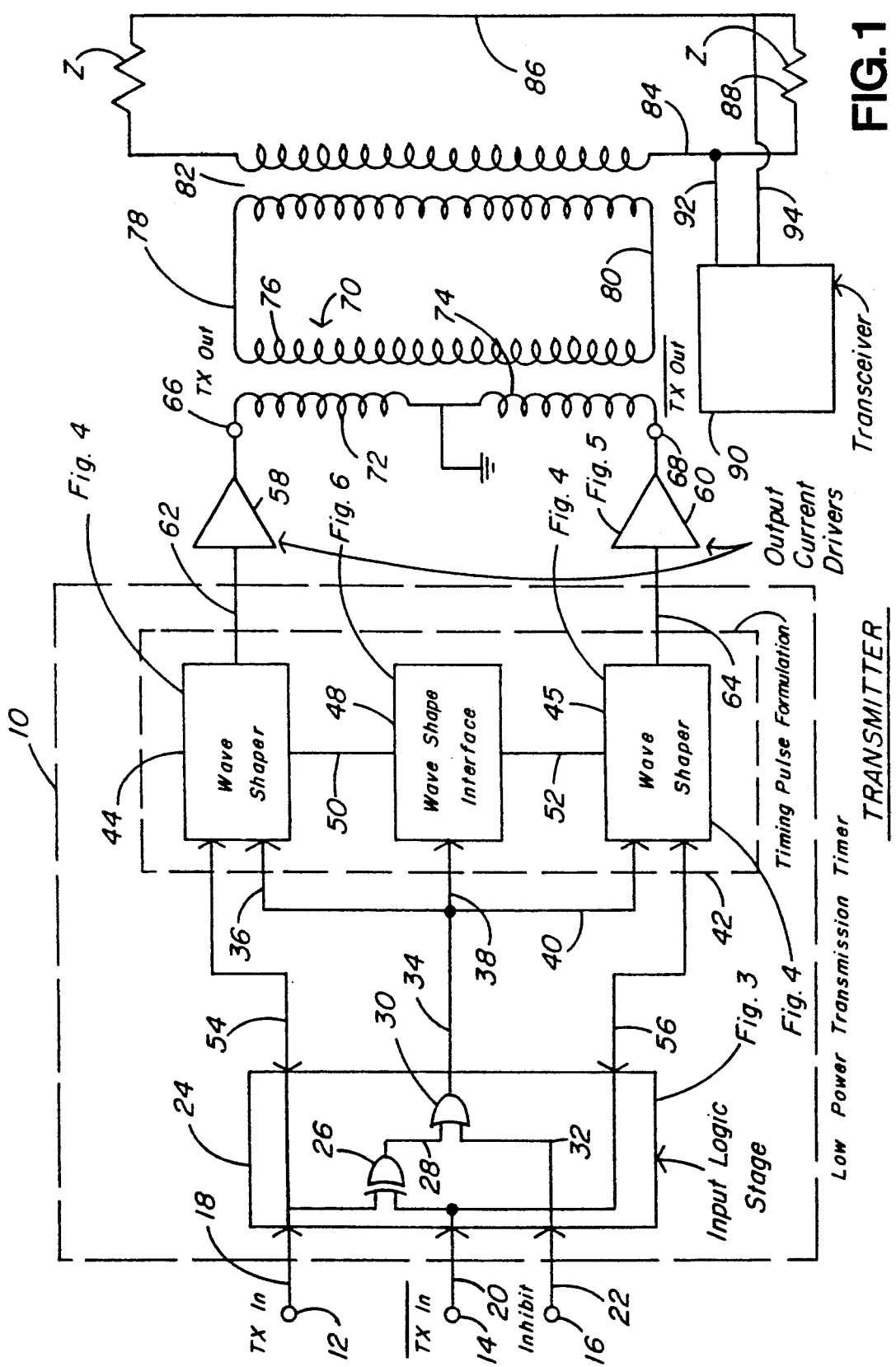
FIG. 1 is a functional block system diagram of the transmitter section of the monolithic transceiver according to the present invention.

Referring now to FIG. 1, the transmitter section of the five volt monolithic 1553 transmitter includes a low power transmission timer or timing circuitry 10 which is connected to receive bi-phase digital input data TX IN and $\overline{TX\ IN}$ and INHIBIT signals at the input terminals 12, 14, and 16, respectively. The input terminals 12, 14, and 16 are connected by way input lines 18, 20, and 22, respectively, to an input logic stage 24 shown in schematic circuit diagram in FIG. 3 described below. The logic input stage 24 includes an EXCLUSIVE OR gate 26 connected as shown to receive the TX IN and $\overline{TX\ IN}$ bi-phase digital data at the input terminals 12 and 14, respectively. Output signals which appear on line 28 from the EXCLUSIVE OR gate 26 are applied as one input to another, conventional OR gate 30. A second input 32 to the conventional OR gate 30 is connected by way of line 22 to receive INHIBIT signals at the input terminal 16 as indicated.

The output signals on line 34 at the output of the OR gate 30 are connected as shown by way of three separate input connections 36, 38, and 40 to a sync pulse timer and pulse timing stage 42. The sync pulse timing stage 42 includes a pair of identical wave shaping stages 44 and 45 for each of the two data channels of the monolithic transmitter described herein, and a wave shape interface stage 48 is connected as shown to receive input data on line 38 from the output 34 of the logic input stage 24. This wave shape interface stage 48 is operative to control the timing of the two wave shaping stages 44 and 45 by way of timing signals applied via output lines 50 and 52 and applied as inputs to the two wave shaping stages 44 and 45, respectively.

The TX IN input data at the input terminal 12 is applied by way of connection 54 as a second input to the wave shaping stage 44 in a first channel of the transmitter, and similarly, $\overline{TX\ IN}$ data received at the input terminal 14 and applied to the input conductor 20 is additionally connected by way of conductor 56 as a second input data line to the wave shaping stage 45 in a second channel of the transmitter. The arrows going both ways on lines 54 and 56 between the logic input stage 24 and the sync pulse timer stage 42 indicate functionally that signals are being fed in both directions to and from the wave shaping stages 44 and 45 and the logic input stage 24. As will be explained in significant detail below with reference to FIGS. 3 and 4, feedback signals from the wave shaping stages 44 and 45 to the logic input stage 24 ensure that one of the above two data channels in the transmitter is completely turned off before the other channel therein turns on. This novel feature in turn minimizes power consumption, maximizes power transmission efficiency and eliminates current spiking and current drain in the two output sections of the two out-of-phase transmitter channels in FIG. 1.

Each of these two transmitter data channels includes an output current driver stage 58 and 60 connected as shown to receive output data via lines 62 and 64, respectively, from the wave shaping stages 44 and 45. The output current driver stages 58 and 60 are operative to provide TX OUT and $\overline{TX\ OUT}$ analog data at the respective output terminals 66 and 68 for the two transmitter data channels.

Briefly summarizing the overall function and operation of the transmitter system shown in FIG. 1, the EXCLUSIVE OR gate 26 will produce a "true" output signal on line 28 only when the TX IN and $\overline{\text{TX IN}}$ signals are received in phase on the two data input terminals 12 and 14. This condition where a "true" (or high signal swing using positive logic) INHIBIT signal is present will serve to keep both transmitter outputs off and in a high impedance state by interfacing to the waveshape circuitry via line 34. When TX IN and $\overline{\text{TX IN}}$ signals are received out of phase and further when there is no INHIBIT signal received at the data input terminal 16 and applied to a second input of the OR gate 30, the wave shape interface stage 48 operates to generate timing signals on lines 50 or 52, respectively. This in turn causes either the wave shaper stage 44 to pass TX IN signals $\overline{\text{TX IN}}$ therethrough or to cause the wave shaper stage 45 to pass signals therethrough to one or the other of the output driver stages 58 and 60.

The data output terminals 66 and 68 will typically be connected to a center tapped output transformer which is designated generally as 70 and includes two primary windings 72 and 74 which are center tapped to ground potential as shown. Thus, as will be more clearly understood with reference to the schematic circuit diagrams shown below, each of the two data channels including the output drivers 58 and 60, respectively, operates to ensure that one or the other of the center tapped primary windings 72 and 74 is completely turned off and nonconducting before the other transformer winding is turned on and driven to conduction.

The output transformer 70 further includes a single secondary winding 76 connected as shown over output data lines 78 and 80 and typically connected to a remote transformer 82 whose secondary winding is also connected a pair of data bus lines 84 and 86 terminated in a load impedance 88 of about 70 ohms. Typically, a remote transceiver 90 will be connected to the data bus lines 84 and 86, and the receiver section of the transceiver 90 will operate to process the TX OUT and $\overline{\text{TX OUT}}$ data which is coupled, respectively, from the two primary transformer windings 72 and 74 and into the secondary winding 76 of the transformer 70. The turns ratio of the transformer 70 will typically be about 1 to 2.5 in order to be compatible with the five volt power supply used for powering the transceiver described herein and for providing the necessary 5 to 1 step down in current between the current flowing in the two primary windings 72 and 74 and the current flowing in the secondary winding 76 as shown. Alternatively, however, there is a different bus connection that uses a transformer turns ratio of 1 to 1.79.

Figure 2:
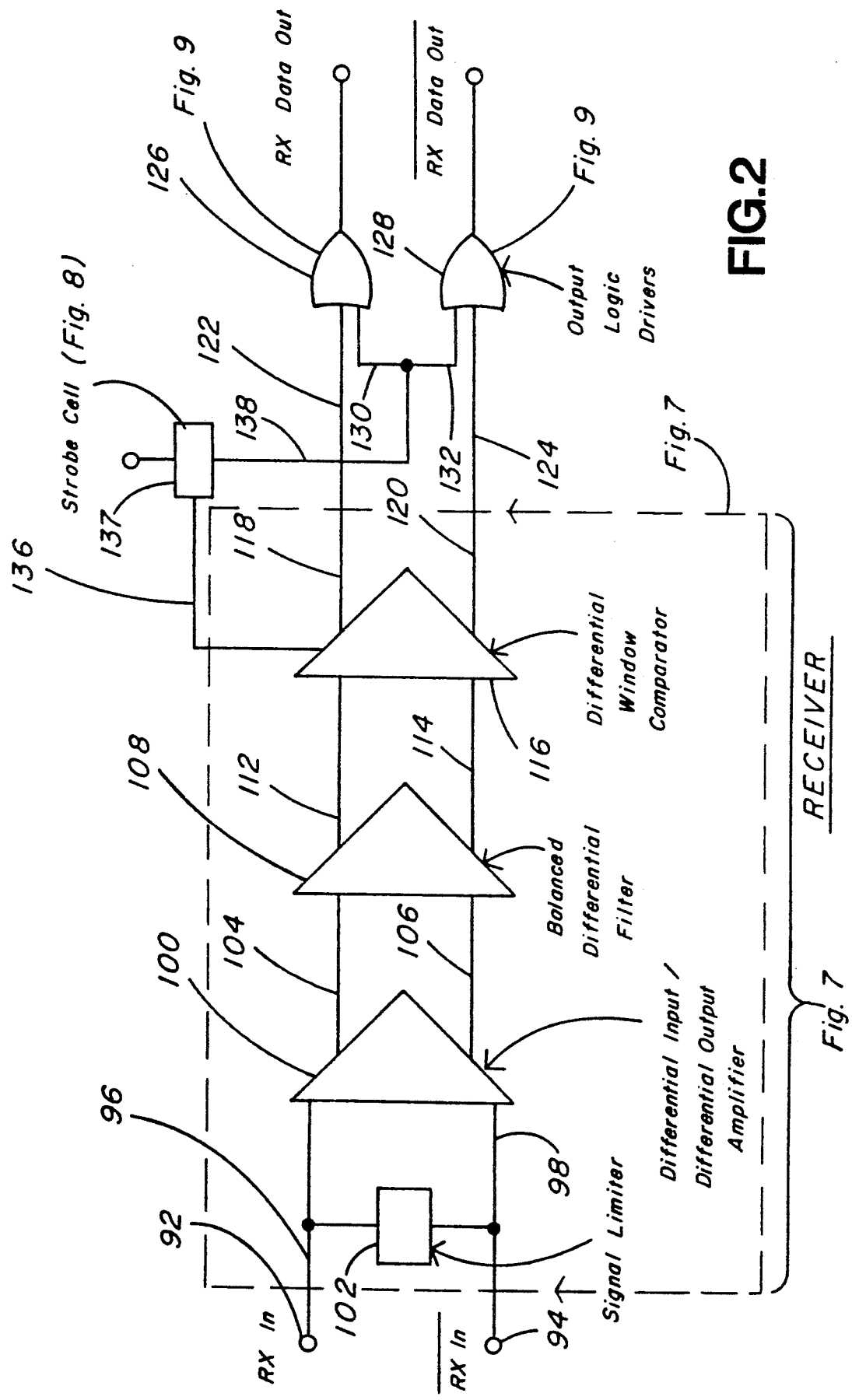
FIG. 2 is a functional block system diagram of the receiver section of the monolithic transceiver according to the present invention.

Referring now to the receiver section of the transceiver shown in FIG. 2, the RX IN and $\overline{\text{RX IN}}$ data derived by way of example from the two input conductors 92 and 94 as shown in FIG. 1 are received as biphase input data on lines 96 and 98 in FIG. 2 and applied as differential input signals to a differential input/differential output amplifier stage 100. A signal limiting stage 102 is connected as shown across the two data input terminals 92 and 94 to provide the required voltage amplitude limiting of the bi-phase or differential signal voltage swings on the input conductors 96 and 98 to the differential amplifier stage 100.

The differential output conductors 104 and 106 from the differential amplifier stage 100 are connected as shown to a balanced differential filter consisting of the two stages 108 and 110 in each of the two data channels for the receiver. The output conductors 112 and 114 from the balanced differential stages 108 and 110 within the balance differential filter are in turn connected as inputs to a differential window comparator 116. The schematic circuitry which has been developed to integrate the signal limiting stage 102, the differential input/differential output amplifier stage 100, the balanced differential filter stages 108 and 110, and the differential window comparator stage 116 is shown in the schematic circuit diagram in FIG. 7 described below.

The output conductors 118 and 120 from the differential window comparator 116 are connected as shown to one input of each of a pair of output logic drivers 126 and 128. The other two inputs 130 and 132 to the output logic drivers 126 and 128 are connected at a common node to a strobe line 134, and the strobe line 134 is further connected by way of conductor 136 from the strobe cell 137 back to control the timing of the differential window comparator stage 116. The output logic driver stages 126 and 128 are operative to generate RX DATA OUT and $\overline{\text{RX DATA OUT}}$ on the two output conductors 138 and 140, and the integrated schematic circuitry and associated level translation electronics is described in more detail below with reference to the schematic circuit diagram in FIGS. 7 through 9 below.

Briefly described, the differential signal received on the input terminals 92 and 94 is appropriately amplified in the differential input/differential output amplifier stage 100 before being applied to the balanced differential filter stages 108 and 110 which establish the bandwidth and the gain versus frequency characteristic of the receiver stage and sets the slope and Q point of this operational characteristic. The differential window comparator stage 116 is operated at a predetermined bandwidth window and is operative only upon receipt of RX IN and $\overline{\text{RX IN}}$ data within this window or frequency band to provide input drive signals to the two output logic drivers 126 and 128 which in turn generate the RX DATA OUT and $\overline{\text{RX DATA OUT}}$ as indicated. The strobe line 134 from the strobe cell 137 is provided to inhibit the received signal from actually being an output from the receiver. If the strobe signal is transistor-transistor logic (TTL) high, the receiver operates normally. If the strobe signal is TTL low, no signal is passed through the receiver. The strobe cell on the monolithic die is indicated generally as 137 in FIG. 2 and is described in circuit detail below with reference to FIG. 8. The two output lines 136 and 138 of the strobe cell 137 are connected, respectively, to the differential window comparator stage 116 and the two output logic drivers 126 and 128 and operate in a manner to be described in more detail below with reference to FIGS. 7 through 9 herein.

Figure 3:
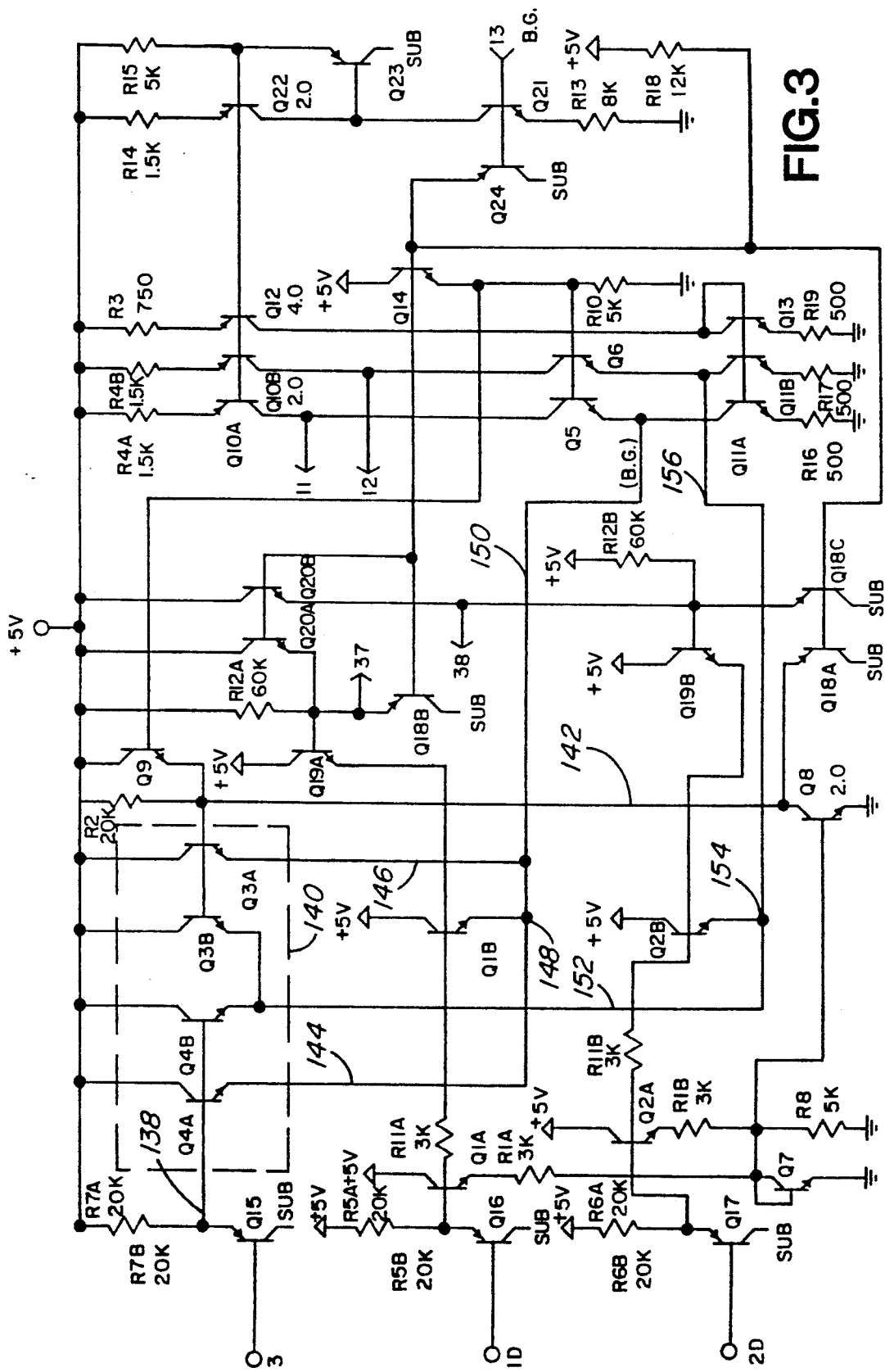
FIG. 3 is a schematic circuit diagram of the logic input stage shown in FIG. 1.

Referring now to the integrated logic circuitry shown in FIG. 3, conventional integrated circuit electronics legend and notation have been used to identify the various transistor and resistor components formed in a monolithic integrated circuit and alternatively referred to herein as the L85 logic circuitry. The letter "Q" indicates that the associated device is a transistor in FIGS. 3 and 5, whereas in FIGS. 4, 6, 7, 8, and 9 the transistors are denoted by the use of letters S, T, X, Y, and Z, respectively. The letter "R" throughout the various figures denotes a resistor, and the number adjacent these resistors is the resistor value in ohms. The letter "C" in certain ones of the figures denotes a capacitor, and the notation "pfd" of "ufd" refers to picofarads or microfarads, respectively. The letter "K" adjacent the resistors throughout the various figures denotes kilohms. and the letters "A and B" denote that the associated device or component forms part of either the "A" channel or the "B" channel within the L85 logic circuitry.

In order to simplify the explanation and understanding of the operation of the L85 logic circuitry shown in FIG. 3, some of the main data or signal processing interconnections within this circuitry will be initially identified in order to provide the reader with a basic understanding of how the different levels of input signals TX IN and $\overline{\text{TX IN}}$ and INHIBIT signals applied at terminals 12, 14, and 16 (FIG. 1) will influence and control the signal levels on the output conductors 34, 54, and 56 leading from the logic input stage of FIG. 1 to the inputs of the wave shaper and wave shape interface stages 44, 45, and 48. Then, a specific example of switching operation of the L85 logic circuitry in FIG. 3 in response to a particular set of applied input data will be provided in order to complete the description of operation of this circuitry.

Referring again to FIG. 3, the input terminal 3 at the base of the common collector, vertical substrate PNP buffer input transistor Q15 corresponds to the INHIBIT terminal 16 in FIG. 1, whereas data terminal 1D at the base of the buffer PNP input emitter follower transistor Q16 corresponds to the $\overline{\text{TX IN}}$ input terminal 12 in FIG. 1. The input data terminal 2D in FIG. 3 at the base of the buffer transistor Q17 corresponds to the TX IN data input terminal 14 in FIG. 1. All of the buffer transistors Q15, Q16, and Q17 in FIG. 3 are vertical PNP emitter follower transistors which are connected at their emitter terminals to drive output NPN transistors in a manner to be described. The emitter of the INHIBIT PNP transistor Q15 is connected directly via conductor 138 to emitter coupled current mode logic circuitry 140, whereas the two buffer PNP transistors Q16 and Q17 are connected through their respective output NPN transistors Q1A and Q2A and further by way of a current source NPN transistor Q8 to another input connection 142 to the logic circuitry 140. The logic circuitry 140 and the input connections and output connections thereto described below functionally constitute the EXCLUSIVE OR gate 26 and the associated conventional OR gate 30 shown in block diagram form in FIG. 1 above.

A pair of output conductors 144 and 146 from the current mode logic stage 140 are connected to a common node 148 and then by way of conductor 150 to an output NPN switching transistor Q5 described below. Similarly, another output conductor 152 from the NPN logic circuitry 140 is connected by way of node 154 and line 156 to another output NPN switching transistor Q6 in the output portion of this logic circuitry. As will be described, the output switching transistors Q5 and Q6 are alternately switched into and out of conduction out of phase to provide a differential signal on their corresponding output nodes 11 and 12. The signal at node 11 is applied as one data input terminal to one of the wave shaper stages 44 and 45 in FIG. 1, and the signal at node 12 is applied to the other of the two wave shaper stages 44 and 45. In a similar manner, the signals at the data nodes 37 and 38 in FIG. 3 are applied as an additional data input signals to the wave shaper stages 44 and 45, respectively, in FIG. 1, so that nodes 11 and 38 are connected to the wave shaper stage 44, and the data nodes 12 and 37 are connected as two inputs to the other channel wave shaper stage 45 in FIG. 1.

The PNP emitter follower buffer input transistors Q15, Q16, and Q17 additionally function to set the proper input threshold voltages which are temperature compensated and stabilized in the range of a solid 1.2 to 1.3 volts directly in the middle of the TTL logic swings being applied to the base inputs of these three transistors Q15, Q16, and Q17.

Referring now to the EXCLUSIVE OR function for the logic circuitry 140, this switching action is achieved by, among other things, the use of the NPN transistor Q1A connected through resistor R1A to diode Q7 and further by the use of transistor Q2A connected through the emitter resistor R1B and also into the collector base junction of transistor connected diode Q7. The current flowing in Q7 is mirrored by the current source transistor Q8, and the collector current of transistor Q8 and flowing in line 142 through pull-up resistor R2 pulls down on the voltage at the base of 3A and Q3B within the logic stage 140. Now, if a positive going signal (using positive logic) is applied to either of inputs 1D and 2D at the bases of Q16 and Q17, respectively, these devices will be turned off, driving the bases of Q1A and Q2A high and turning these devices on to sink current through the respective emitter resistors R1A and R1B into the diode Q7. The current in diode Q7 is mirrored by the current in NPN transistor Q8, and the base resistor R8 connected in parallel with Q7 is used to establish the proper threshold voltage at the base of NPN transistor Q8. Conversely, if both 1D and 2D are low at the same time, then no current flows into Q7 and Q8, and line 142 at the bases of Q3A and Q3B remains high. At this time, the base voltage of Q3A is pulled up by resistor R2.

Now consider the case when the INHIBIT pin 3 is high, turning off Q15 and driving the bases of Q4A and Q4B high. This switching action in turn causes Q4A to pull up on the emitters of Q1B and Q3A, and also causes Q4B to pull up on the emitter of Q2B at node 154 and the emitter of Q3B. Thus, the EXCLUSIVE OR function comes about by producing a high level voltage at the base of Q3A and Q3B if both the bases of Q16 and Q17 are simultaneously low.

Now further exploring the EXCLUSIVE OR function of FIG. 3, consider the case when the data input terminals 1D and 2D are simultaneously high. Since the off state of each of the channels 1D and 2D is the condition where the signals are high at the inputs of Q16 and Q17, then this is a condition which forces each of the two channels off and no data is transmitted thereby.

Now consider the situation when the INHIBIT signal at input terminal 3 is low and the input data applied to terminals 1D and 2D are out of phase. This condition will produce the necessary high and low voltage levels on conductors 150 and 156, respectively, to turn off switching transistor Q5 and turn on switching transistor Q6 and thereby in turn control the out of phase output signals at nodes 11 and 12, respectively. In order to gain a better understanding of exactly how this operation works, reference is now made to the reference voltage terminal 13 at the base of NPN transistor Q21 on the far right hand side of the schematic in FIG. 3. The reference voltage terminal 13 is connected on the integrated circuit chip or cell to a bias network which has been constructed to set the reference voltage at the base of Q21 to the bandgap voltage of silicon, which is about 1.23 volts, plus an additional 1 base emitter voltage drop of a diode or transistor base emitter junction and referred to herein as one $V_{BE}$.

Therefore, since the reference voltage terminal 13 is set at the bandgap voltage of silicon plus one $V_{BE}$, then going across the base emitter junction of Q21 leaves the bandgap voltage across resistor R13. The advantageous feature of using the bandgap voltage of silicon of about 1.23 volts as a reference voltage is that this voltage is relatively temperature independent and has a very low temperature coefficient. This feature in turn ensures that the current flowing in R13 is also relatively temperature independent, and this current is mirrored in a current source string consisting of Q22, R14, Q23, R15, and also in Q10A, Q10B, Q12, and their associated emitter load resistors R4A, R4B, and R3. These emitter degenerating resistors R4A, R4B, R3, R14, and R15 are used in combination with the above identified PNP current source transistors connected thereto in order to stiffen (increase) the output impedance of the circuit and thereby help ensure as will be explained in more detail below that one side of the center tapped transformer winding 72 in FIG. 1 is completely turned off when the other primary winding 74 is turned on.

Since R4A equals R4B equals R14 equals R15, the current, I, flowing in these resistors is equal to the current flowing in Q21 and R13, and this is significant since the bi-phase output signal which is dependent upon this current is taken from nodes 11 and 12 at the collectors of Q10A and Q10B, respectively. However, it will be noted that the current 2I flowing in Q12 is twice that of the current flowing in the other above identified PNP current source transistors, since the resistor R3 of 750 ohms is one-half of that of the other current source load resistors R4A, R4B, and R14. In addition, the PNP surface area of Q12 on the monolithic die is four times that of the other current source transistors in order to handle this additional current of 2I which flows into the collector of Q13 and through resistor R19 to ground. This current through Q12 and Q13 is thus mirrored in the NPN transistors Q11A and Q11B, thereby setting up current sources of 2I for the two output switching transistors Q5 and Q6 previously described. Q5 and Q6 are used for controlling the output signals at output nodes 11 and 12, and the current flow into and out of these two nodes during the bi-phase switching operation of this circuit. These common base switching transistors Q5 and Q6 are being held at a reference voltage across R10 which is equal to the reference voltage on R13 as a result of a plus $V_{BE}$ across Q24 and then a minus $V_{BE}$ across Q14. Thus, this is a very useful technique for providing a stable voltage reference across R10 at the base of the output switching transistors Q5 and Q6.

Since the two sinking current sources Q11A and Q11B are drawing a current of 2I, and since the PNP current sources Q10A and Q10B are drawing a current of I, then a difference current of I must be supplied into the nodes 11 and 12 when transistors Q5 and Q6 are conducting. Conversely, when Q5 and Q6 are non-conducting, a difference current of I flows from the nodes 11 and 12 and in the direction of the arrows indicated and is applied to one input of each of the wave shaping stages 44 and 45 in FIG. 1 as will be further described with reference to FIG. 4 below. Therefore, if a signal voltage is applied to lines 150 and 156 at a high level to pull up on the emitters of Q5 and Q6, then this action will turn off Q5 and Q6 and thus generate an output current of I from nodes 11 and 12, respectively.

Therefore, if you follow the emitter of Q5 back through conductor 150, you will see that this connection connects Q5 to Q4A, Q3A, and Q1B at the output of the data channel transistor Q16. This connection in turn means that if the INHIBIT pin 3 goes high to pull up on the base of Q4A, or if the 1D data line goes high to turn off Q16 and pull up on the emitter of Q1B, or if the base of Q3A goes high which also pulls up on node 148 at the output of Q1B, then any one of these conditions will pull up on node 148 and pull up on the emitter of Q5 and will turn off Q5, thereby forcing current out of node 11 in the direction of the arrow shown. As will be shown later, turning off Q5 to source current out of node 11 translates into turning off an associated output stage within the transmitter.

In a similar fashion, the emitter of the output switching transistor Q6 can be traced through conductor 156 and to node 154 at the emitter of Q2B where the emitter of Q2B is connected to the emitter coupled NPN transistors Q3B and Q4B in the logic stage 140. Q2 will thereby be pulled up by either a high voltage level on line 138 or a high voltage level on line 142 at the base of Q3B or by a high data signal applied to the base of Q17 to pull up on the base of Q2B and its emitter to thereby turn off Q6 in a manner similar to that described above with reference to Q5. Thus, when Q6 is turned off to allow node 11 to flow high, a current source of I will flow out of node 12 in the direction of the arrow shown to turn off the other half of the center tapped primary winding 74 in the other transmitter data channel. Therefore, a high signal at either terminal 1D or 2D will cause that particular channel to turn off by turning off Q5 and Q6, respectively, thereby sourcing current out of the nodes 11 and 12 to turn off the particular primary winding 72 or 74 in the output stage.

The other two current source output nodes 37 and 38 are also used to apply a drive signal to another input of each of the wave shaper stages 44 and 45 and are driven out of phase like the previously described nodes 11 and 12. Nodes 11 and 38 are connected as two inputs to one wave shaper stage 44, whereas nodes 12 and 37 are connected as two inputs to the other wave shaper stage 45. The discussion that follows will show how these two nodes 37 and 38 are simultaneously driven out of phase along with the previously described nodes 11 and 12.

Referring now specifically to node 37, when Q18B turns on its emitter is at the bandgap voltage plus 3 $V_{BE}$, or the voltage at node 13 plus the $V_{BE}$ of Q24 and the $V_{BE}$ of Q18B. This in turn means that the emitter of Q19A is at the bandgap voltage plus two $V_{BE}$ and that the emitter of Q1B is at the bandgap voltage plus one $V_{BE}$. This in turn means that the emitter of Q1B is holding the emitter of Q5 at the bandgap voltage plus one $V_{BE}$. However, it has previously been determined above that the base of Q5 is also held at bandqap voltage plus one $V_{BE}$ across R10, which means that when Q18B is conducting, Q5 is turned off. The point of this is that if node 37 is allowed to be high, it pulls up on the emitter of Q5 to turn this channel off. Similarly, in the case of node 38, if node 38 is allowed to float high, it will be clamped by Q18C to the bandgap voltage plus 3 $V_{BE}$. This in turn means that, subtracting one $V_{BE}$ from Q19B and one $V_{BE}$ from Q2B, node 154 will also be like node 148 at the bandgap plus one $V_{BE}$ to thereby maintain Q6 off.

The reason for the existence of nodes 37 and 38 is so that they will operate as follows: The input data coming into nodes 1D and 2D in FIG. 3 are square waves, whereas the outputs out of nodes 11 and 12 are trapezoidal in shape, and have specifically defined rise and fall times or slew rates. Thus, with respect to the out of phase operation of Q16 and Q17, you do not want Q16 to start turning on until Q17 is turned off completely. However, in response to a square wave signal on line 2D, node 12 will not turn off instantaneously on the leading edge of the square wave pulse, but rather its current will decay trapezoidally as a result of stray capacitance at node 12. Therefore, without some form of compensation, this pulse input condition at input terminals 1D and 2D will cause both channels to be on at the same time, and this in turn will cause a major current spike and a major current drain problem in the output stages of the transmitter.

In order to prevent this from happening, output signals from the wave shaping cells 44 and 45 as indicated by the left hand directed arrows on lines 54 and 56 in FIG. 1 are fed back to the logic circuitry in FIG. 3 so that when the wave shaping cell for one channel is on, it allows the appropriate node, either node 37 or 38, to control the other channel 37 or 38 and cause one of these nodes to float high, keeping that channel off. This in turn ensures that one of the two channels Q16 or Q17 cannot be turned on by the incoming square wave pulse until the other channel has been completely turned off. At such time that one channel completely turns off, either node 37 or node 38 will then be pulled down and allow the other channel which would otherwise come on in response to the leading edge of the square wave pulse on 1D or 2D to finally come on.

Figure 4:
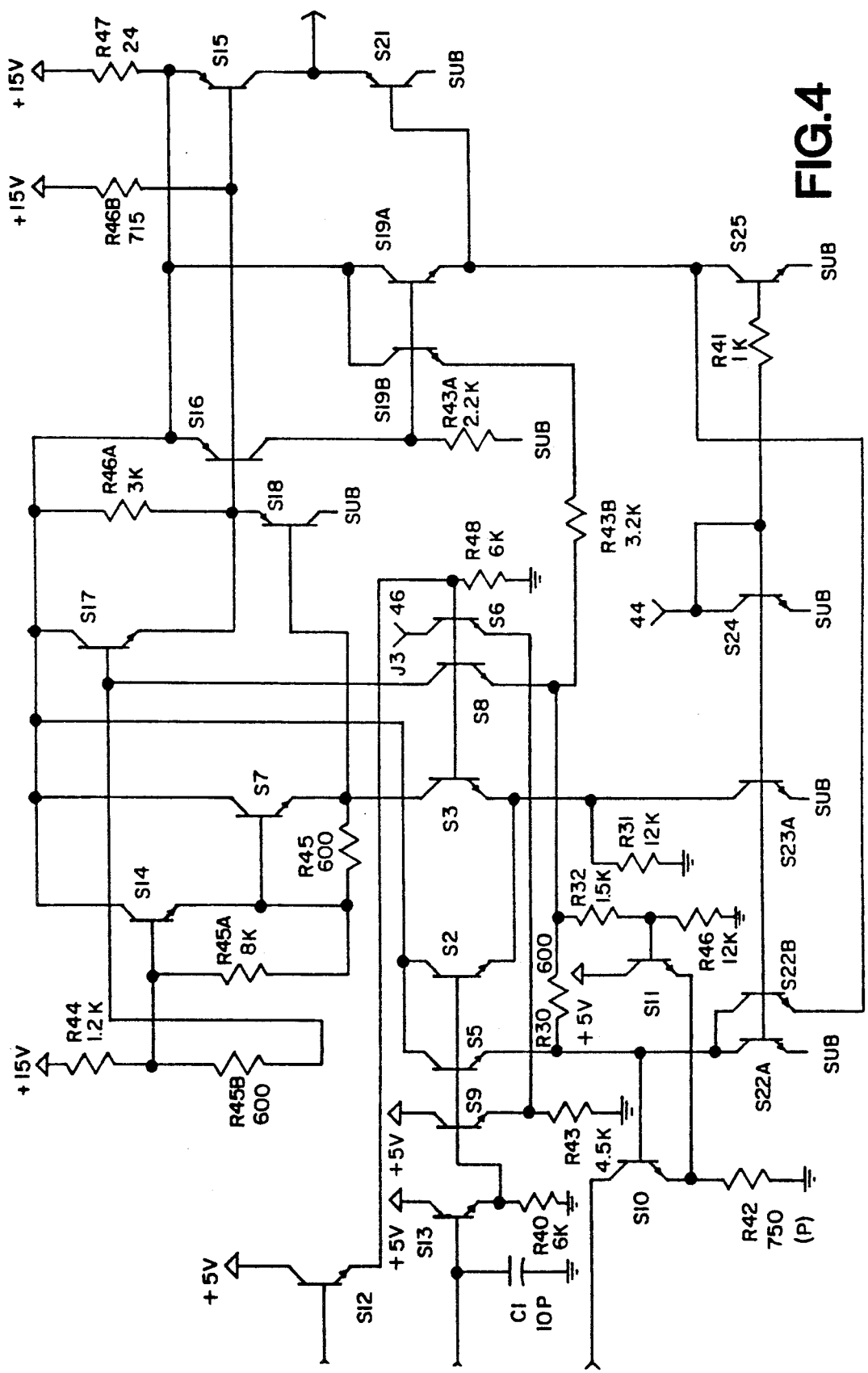
FIG. 4 is a schematic circuit diagram of the electronics for each of the two wave shaper stages shown in FIG. 1, including novel current drive and feedback circuitry operative to force a high current lateral PNP driver transistor to turn on and off quickly.

Referring now to the wave shaping circuitry in FIG. 4, the transistor designation in this figure is "S" instead of the conventional "Q" in order to avoid duplication of reference numerals and letters in the specification. Also, it will be necessary at this point to briefly describe this circuitry in order to gain an understanding of the cross coupled feedback operation between the logic circuitry in FIG. 3 and the wave shaping circuitry in FIG. 4. Further down in the specification, there is provided a more detailed description of FIG. 4, particularly with regard to the high speed switching operation of the output lateral PNP switching transistors therein.

Nodes 11 and 12 in the logic circuitry of FIG. 3 are connected, respectively, to an input NPN buffer transistor Q13 in each of two identical wave shaping circuits (stages 44 and 45 in FIG. 1), and nodes 37 and 38 in the logic stage of FIG. 3 are connected, respectively, to each of two identical input transistors S10 in each of the wave shaping stages 44 and 45. The circuitry shown in FIG. 4 additionally includes current mode logic NPN switching transistors S9, S5, and S2 differentially connected to similarly arranged emitter coupled NPN transistors S3, S8, and S6. Current sourcing for FIG. 4 is provided by transistors S22A, S22B, S23A, S24, and S25, whereas high speed turn on and turn off drive for the output lateral PNPs S15 and S21 is provided primarily by the control transistors S7, S14, S16, S16A, S17, S18, S19A, and S19B. As earlier indicated, a detailed description of the operation of these control transistors is provided below.

To better understand the above cross coupled feedback connection and operation between the output of the wave shaping cells 44 and 45 and the inputs to the logic circuitry in FIG. 3, consider the following example: Assume that the INHIBIT signal on Node 3 in FIG. 3 is low and further assume that input terminal 1D is low and that input terminal 2D is high. Also assume that input terminal 1D has been low for some time and that input terminal 2D has been high for time and that the switching operation for the circuit is not near the data channel switch point. Thus, if terminal 1D is low this means that Q5 is now turned on and that Q6 is now turned off. Thus, with the emitter of Q5 floating low, a current I flows into node 11, pulling down on node 11. This in turn means that wave shaping terminal 11 is being turned on and that one of the output current driver stage 58 or 60 in FIG. 1 driven by the shaping terminal 11 is turned on. Therefore, pulling down on terminal 11 in the wave shaping cell in FIG. 4 turns off S13, and pulls down on S9 and S5 in the wave shaping cells and turns on S6 and S8 and turns off S9 and S5 in the above identified current mode logic. Simultaneously, S2 turns off and S3 turns on.

Figure 5:
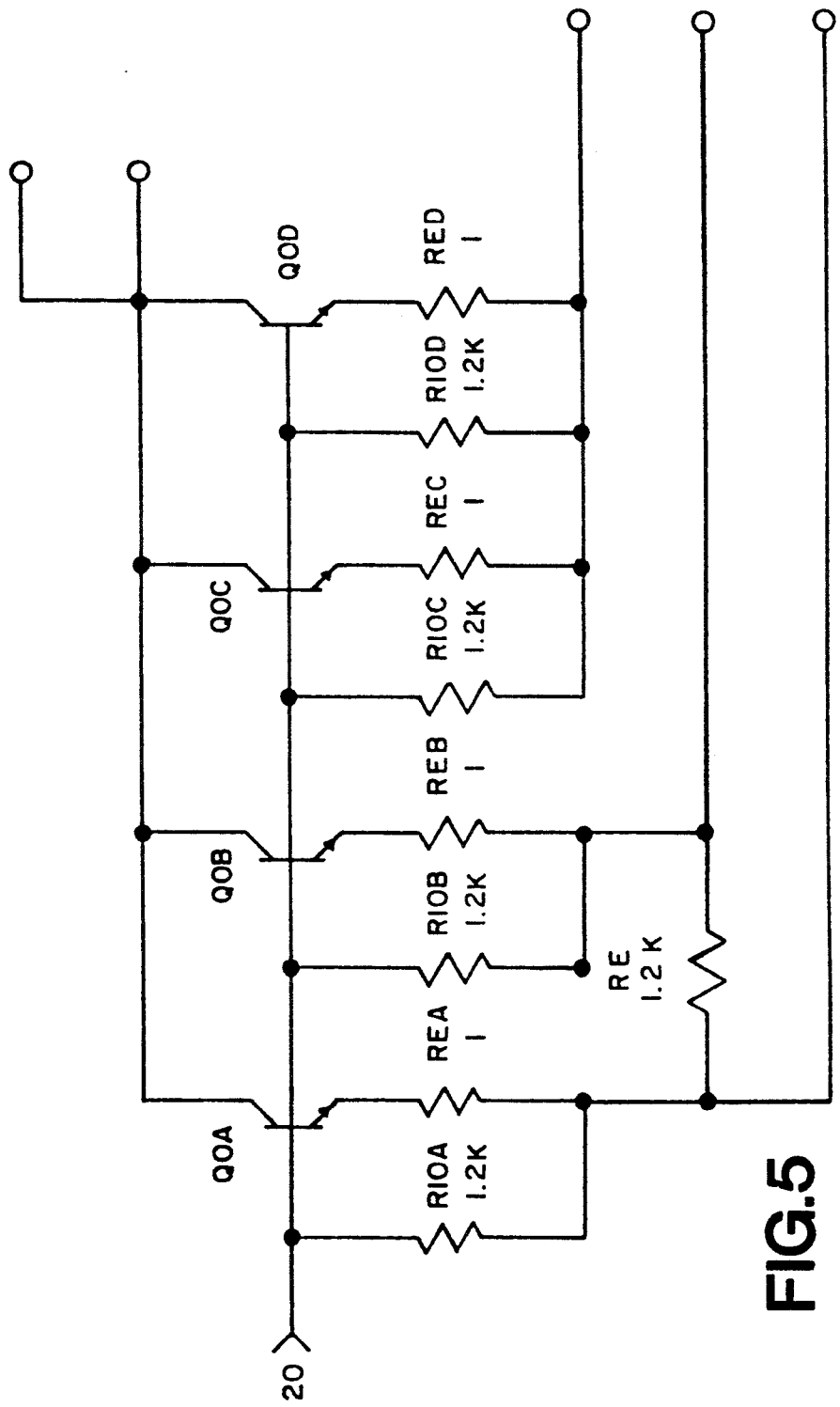
FIG. 5 is a schematic circuit diagram for each of the two identical output current driver stages shown in FIG. 1, with each output current driver stage exhibiting a high impedance off state for the monolithic transceiver described herein.

When S3 turns on, current is now pulled through S14 and S7 at the collector of S3, and when the emitter of S7 is pulled down, this pulls down on the base of S18, turning S18 on, pulling down on the bases of S16 and S15 and also turning on S16 and S15. When current is now sourced out of S15, this has the effect of pulling up on output node 20, and the output node 20 in turn drives a plurality of NPN output transistors (See FIG. 5) connected to one of the center tapped primary windings 72 or 74. Therefore, by pulling down on the voltage level on node 11 below the reference voltage at reference node 4, this has the effect of supplying current from the collector of S15 and out of node 20 to an output transformer coil connected as shown in FIG. 5 below. Thus summarizing, when 1D goes low, Q5 is turned on, pulling node 11 low and ultimately turning on the coil to produce the TX OUT output signal in one of the NPN current driver stages 58 and 60. Conversely, with 2D high, Q6 is turned off and node 12 floats high, turning off wave shaping channel 12 in the other wave shaping stage 44 or 45 in FIG. 1 and shown in schematic diagram in FIG. 4, thereby turning off TX OUT in the other coil 72 or 74 in the other output current driver circuit 58 or 60 identical to FIG. 5.

Referring again to the wave shape circuitry in FIG. 4, when terminal 11 floats low at the base of S13, the base of S5 will be lower than the base of S8. The emitter of S5 in turn establishes the reference voltage at the base of S10, whereas the emitter of S8 which is connected down through the divided resistors R32 and R46 establishes the reference voltage at the base of S11. When the emitter of S5 falls below the base of S11, S10 turns off, and when S10 turns off it is no longer pulling current out of node 38, thereby allowing node 38 to float high. Therefore, pulling down on the voltage level at node 11 causes the voltage at node 38 to float high. Conversely, pulling up on the voltage at node 11 causes the node 38 to go low. However, node 38 in the wave shape cell in FIG. 4 feeds back into node 38 of FIG. 3 of the logic thus causing node 38 of the logic, which floats high, to drive the base of Q19B high, thereby driving the base of Q2B high, whose emitter then maintains Q6 off. However, Q6 was already turned off since 2D was high, so that this action continues to maintain Q6 off where it would otherwise want to turn on.

Now, assume for the moment that the polarities on nodes 1D and 2D in the logic of FIG. 3 are instantaneously changed and that 1D which was low now goes high and 2D which was high now goes low. When 2D goes low, it pulls down on one end of resistor R11B, and if it were not for the connection of Q19B to the base of Q2B, Q2B would be otherwise turned on to thereby pull down on the emitter of Q6 and turn on channel 12 of the logic stage in FIG. 3. But Q19B will not allow Q2B to turn on, so that Q6 of the logic remains off and will not allow Q2B to turn on until wave shape node 11 changes states. Thus, Q6 of the logic in FIG. 3 will remain off until wave shape node 11 in FIG. 4 changes states. Now, consider what causes wave shape node 11 in the logic to change states. When 1D went high, this action pulled up on the emitter of Q5, allowing node 11 to go high. When wave shape node 11 goes high, the emitter of Q5 will drive the base the Q10 higher than the base of Q11, causing node 38 to be pulled low. This switching action in turn causes the base of Q19B in the logic to be pulled low, and Q19B will no longer hold Q6 of the logic off, thereby now allowing Q6 of the logic to turn on.

All of the above switching action does not happen instantaneously, since there is parasitic capacitance at nodes 11 and 12 of the logic circuitry in FIG. 3, and these nodes do not move instantaneously like a squarewave. That is to say, these nodes move like a trapezoid, and this is why trapezoidal wave forms are generated at nodes 11 and 12. However, it should be noted that the slew rate at nodes 11 and 12 of the logic in FIG. 3 is not the limiting factor on the switching speed of the transmitter, but rather the limiting factor on the transmitter switching speed is the speed with which one is able to switch the lateral PNP transistors S15 and S16 of the wave shape cell in FIG. 4 on and off.

Referring now to the output PNP transistor pair S15 and S21 of the wave shape circuitry in FIG. 4, together with the L85 TX output schematic shown in FIG. 5, the lateral PNP transistor S15 in FIG. 4 conducts to source current out of node 20 and into the bases of the four parallel connected NPN transistors Q0A, Q0B, Q0C, and Q0D shown in FIG. 5. In actual practice, these four NPN transistors have been laid out in parallel on a monolithic die to provide for handling the required current density for driving the coil 72 connected as shown to the emitter outputs and at the emitter ballasting resistors REA, REB, REC, and RED. These emitter ballasting resistors REA, REB, REC, and RED are present to keep the current load balanced equally in the above four parallel connected NPN transistors Q0A, Q0B, Q0C, and Q0D.

Emitter bypass and base biasing resistors R10A, R10B, R10C, and R10D are connected as shown between the bases of these four NPN transistors and one end of each of these emitter ballasting resistors, respectively, to provide appropriate base bias during circuit operation. The collectors of the above four NPN transistors Q0A, Q0B, Q0C, and Q0D are connected as shown to a source of collector voltage supply, Vcc, which is also at 5 volts. The emitters of transistors Q0A and Q0B are separated from the emitters of transistors Q0C and Q0D in FIG. 5 to allow only two wire bonds (not shown) to the transceiver chip to handle the large load currents in this circuitry. Thus, when output transistor S15 in the wave shape circuit in FIG. 4 is conducting, the four NPN transistors in FIG. 5 defined above are also conducting to supply current to the coil 72. When the L85 TX output circuit in FIG. 5 turns off, base charge will be pulled out of these four NPN transistors by the current conducted into the emitter of the complementary output transistor S21 in FIG. 4.

The significant problem which must be guarded against in the output current drive operation for the output node 20 in FIG. 4 and to the bases of the four NPN current drive transistors in FIG. 5 is to ensure that when node 20 in these two figures goes below ground, none of the four NPN transistors shown in FIG. 5 can turn back on and thereby produce a low impedance state and current spiking in this circuit. One of the ways to accomplish this is to use a relatively low 600 ohm pull up resistor R46B at the base of S15 in FIG. 4 to ensure that this lateral PNP transistor remains off when it is turned off, even when node 20 at the collector of S15 goes below ground. However, operating at frequencies on the order of 1 megahertz, it could be possible to develop a current across the base collector junction of S15 proportional to the capacitance, C, across this junction multiplied by the dynamic dV/dt at the collector base junction of S15. This C·dV/dt when beta multiplied by the gain of S15, could possibly cause S15 to turn back on when node 20 goes below ground.

In order to prevent this from happening, there is provided an NPN transistor S17 connected as shown in parallel between the base and emitter of S15, and S17 is biased to turn on as S15 is turning off to thereby rapidly pull charge out of the base of S15 and thereby prevent its returning to a conductive state. Similarly, it is also important to ensure that the C·dV/dt current developing across the base emitter junction of the other output transistor S21 is insufficient to turn on this transistor, and this accomplished by clamping the base of S21 to the emitter of S22B as shown.

The above operation describes how the transistors S15 and S21 are retained in their off state when the signal at node 20 goes below ground. However, when the signal at node 20 goes above ground, there is no concern about S15 turning on since the emitter node thereof is being pulled up. However, at this time, some means must be provided to prevent S21 from being turned on. As previously indicated, it is the response time of the lateral PNP transistors S15 and S16 rather than the parasitic capacitance at nodes 11 and 12 in FIG. 3 that is the limiting factor on the trapezoidal pulse edge wave shape and slew rate for driving the output circuitry connected to node 20 in FIG. 4. These lateral PNPs S15 and S16 are naturally slow, so means have been taken to speed up the switching times of these two PNP transistors. These PNPs transistors S15 and S16 have a cut off frequency somewhere in the range of 1 to 2 megahertz, and they do not naturally have the response times required without the additional frequency compensating means used herein. However, what is desired and required of this circuit is that these two devices S15 and S16 operate in the 200 nanosecond rise and fall time range, and this translates into a frequency response dV/dt right at or even exceeding the cut off frequency of these devices.

The novel solution to the above problem of increasing the response time of S15 and S16 is to use a feedback approach that will greatly overdrive S15 when turning on to provide the desired level of output current through node 20 at the earliest possible time, and then back off of this current drive in such a manner as to rapidly turn off the devices S15 and S16 once the required level of collector output current from S15 is reached. This is done, for example, by turning on S3 when its base goes high relative to the base of S2, thereby pulling down on the base of S18 and turning on S18 and simultaneously pulling down on the bases of S15 and S16 and rapidly turning these devices on. Simultaneously, the base of S18 is clamped by the emitter of S7. The emitter of S7 is one $V_{BE}$ down from the emitter of S14, and the emitter of S14 is one $V_{BE}$ down from the voltage at the intersection of resistors R44 and R45B.

Assume for the moment that the voltage across resistor R44 is some predetermined delta V. Then, at the emitter of S7 you are two $V_{BE}$ down from that delta V. Now, subtract from this value the $V_{BE}$ of S18 and the $V_{BE}$ of S16 and you now have this same delta V value across the pull up resistor R47 at the emitter of S15. Now consider the fact that the delta V generated across R44 is proportional to the current pulled through S8 and through R45B. In turn, the current through S8 is derived from the current through R30 connected between the emitter of S5 and the emitter of S8. This is a ramping delta V to some finite voltage level. However, by increasing the current through S8 by its emitter connection as shown through resistors R30, R31, and R32, the delta V across R44 can be significantly increased, and together with it the delta V across R47 can be likewise increased to in turn substantially increase the emitter currents which divide between the lateral PNP transistors S15 and S16.

By this technique of increasing delta V across resistor R44, significantly more current can now be forced down into the emitters of S15 and S16 to greatly overdrive these transistors when they are turning on and thereby enable these devices to reach the required output current level at node 20 at a much earlier time than would otherwise be the case. This significantly increases the frequency response of these devices S15 and S16. This will be true in spite of the fact that the AC beta of S15 is approximately 1. This switching action in turn also causes a substantial increase in current in R43A at the collector of S16, and this produces a corresponding increase in voltage across R43A which is applied through the base of S19B and its emitter and through R43B to the emitter of S8, which tends to back off conduction in Q8. This in turn produces a decrease in voltage across R44, causing the voltage across R44 to move up to the supply voltage and thereby also causes the voltage across R47 to move up toward the supply voltage.

As for the rapid turning off the lateral PNPs S15 and S16 and maintaining these transistors non-conducting, it is easy enough to rapidly pull up the emitters of S14 and S7 to a voltage high and thereby rapidly pull up the emitter of S18 and the base voltages of S15 and S16 within a relatively short period of time. However, this switching action alone is insufficient to completely turn off the lateral PNPs S15 and S16 due to the amount of charge stored in these PNP devices during their conduction. Therefore, just as we had to increase the emitter current to rapidly overdrive and turn on these lateral PNP transistors, we now have to provide an increased amount of reverse base current to these lateral PNPs to thereby rapidly pull base charge out of these devices and get them to turn off more rapidly than they would otherwise normally do.

This is accomplished by the particular connection of S17 whose base is connected to R45B and whose base rapidly is pulled up toward the supply voltage when S8 begins to turn off. This action in turn tends to rapidly turn on S17 whose emitter is connected to the base of S15 and whose collector is connected to the emitter of S15, thereby providing an effective discharge loop of current drive into the base of S15 and S16, thereby rapidly turning these two lateral PNP transistors off. However, the slew rate at the output node 20 in FIG. 4 is still very much dependent upon just how rapidly these two lateral PNP devices S15 and S16 are turned on and off using the novel current overdrive turn on technique described herein and control feedback discharge loop rapid turn off technique as described above. Thus, these novel circuit techniques have pushed the lateral PNPs S15 and S16 far beyond their natural device turn on and turn off switching speeds and normal operational limits.

Figure 6:
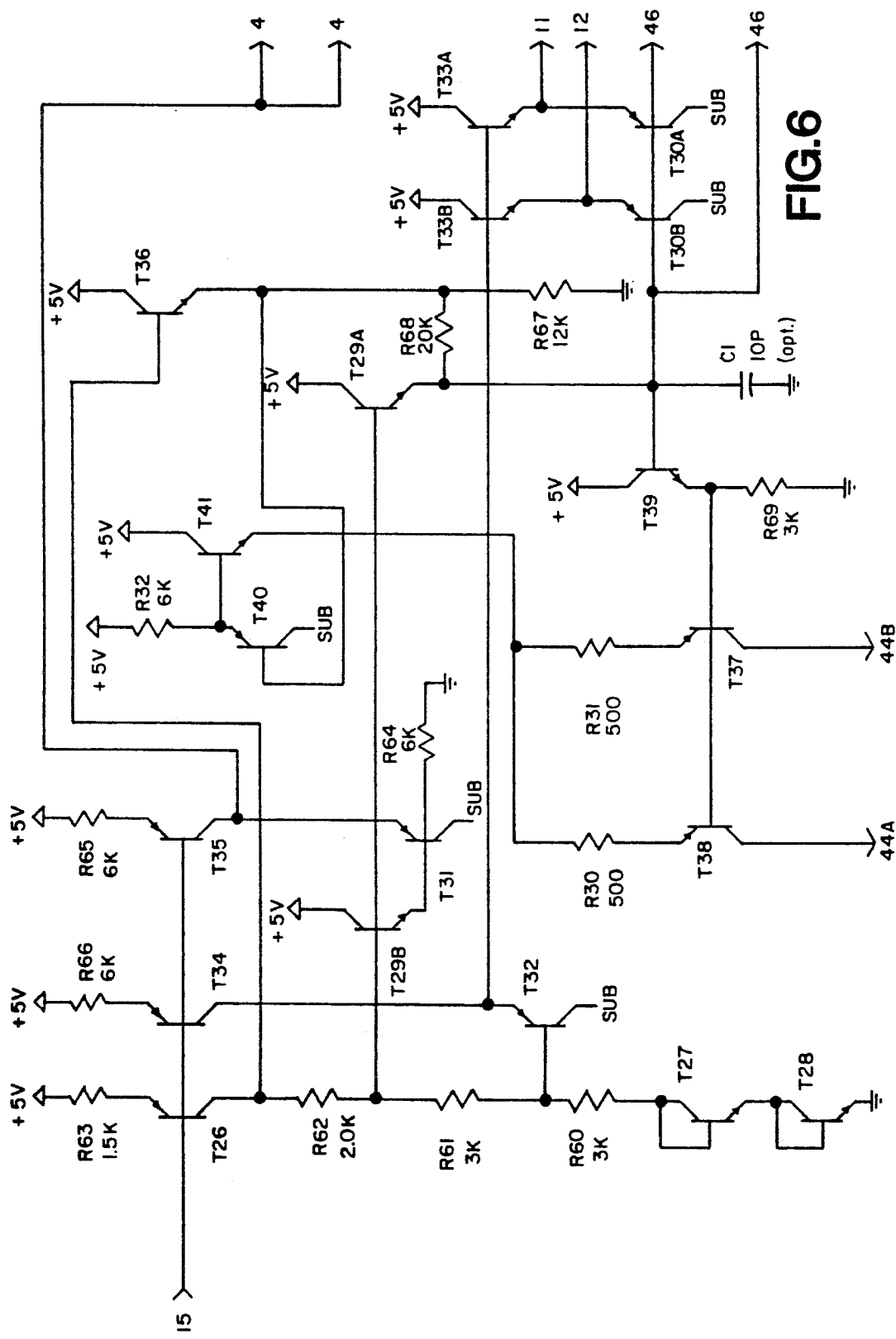
FIG. 6 is a schematic circuit diagram of the wave shape interface stage shown in FIG. 1 and featuring novel sync pulse timing control of the monolithic transmitter shown in FIG. 1 and including novel standby power conservation circuitry.

Referring now to FIG. 6, there is shown a schematic circuit diagram of the wave shape interface stage 48 shown in FIG. 1 and operative in response to input data on line 38 in FIG. 1 (functionally representing nodes 11 and 12 in FIG. 3) to in turn provide controlled sync and timing pulses and biasing levels on outputs 50 and 52 applied to the two wave shaper stages 44 and 45.

When the transmitter in FIG. 1 first starts transmitting, the input signal levels at 1D and 2D in FIG. 3 will be at the same state, so that terminals 1D and 2D will both be either at 0 volts or 5 volts and thereby present an INHIBIT condition within the logic circuitry of FIG. 3. The very first pulse (sync pulse) to be transmitted is always approximately 1500 nanoseconds plus or minus 25 nanoseconds wide, and the sync pulse specification requirements for the TX OUT signal call for this pulse width to be 1500 nanoseconds plus or minus 25 nanoseconds. However, the problem that arises in a number of competitive transceivers is that the transmitter section of the transceiver takes so long to start transmitting that the TX OUT signal falls out of this range of 1500 plus or minus 25 nanoseconds. Another problem, however, is that when the transmitter starts transmitting too fast, the output TX OUT pulse becomes too wide, and again falls out of the above range of 1500 plus or minus 25 nanoseconds. Thus, the novel interface circuit described below with reference to FIG. 6 has been designed and constructed to provide the above required output pulse width regulation for the transmitter.

Referring initially back to the wave shape circuitry in FIG. 4, it will be recalled that the wave shape circuit shown therein has a number of differentially coupled NPN transistors such as S2 and S3 which are being differentially switched on and off. It will also be recalled that, with respect to FIG. 4, the node 4 therein at the base of S12 is being held at some reference voltage. The adjacent node 11 at the base of S13 in FIG. 4 is ramping up toward the level of reference voltage at node 4 and a little beyond, and how much beyond is programmed in the interface cell of FIG. 6 in the manner described below. Subsequently, the voltage at node 11 at the base of S13 in FIG. 4 will ramp down toward the bandgap reference voltage, and the interface circuit in FIG. 6 has also been designed to control this ramp function at the base of S13 in FIG. 4 as described below, thereby ensuring that the above 1500 plus or minus 25 nanosecond pulse width regulation requirements are always met.

Referring again to FIG. 6 where "T" denotes a transistor, the input reference voltage node 15 at the base of PNP transistors T26, T34, and T35 comes out of the bias generating cell on the monolithic die, and the node 15 is set to a voltage level equal to one quarter of a bandgap voltage plus one $V_{BE}$ down from the 5 volt bias voltage shown in FIG. 6. One quarter of a bandgap voltage is approximately 300 millivolts, so that subtracting the $V_{BE}$s of T26, T34, and T35, this places 300 millivolts across each of the emitter resistors R63, R66, and R65, and this 300 millivolts is supply voltage independent and also temperature independent. This voltage of 300 millivolts thus defines the current running through R63, R66, and R65, and this current also flows out of the collector of T26 and through R62, R61, R60, and into the diode connected transistors T27 and T28. Now, by examining the ratio of the resistor values for R62, R61, and R60 we can establish what the voltage will be at the base of T29B and at the base of T32, and of course considering the two $V_{BE}$ voltage drop across diodes T27 and T28. Thus, from the above it can established that there is a 600 millivolt drop across R61 and there is also a 600 millivolt drop across R60, so that 600 millivolts has been determined to be the ramp voltage on nodes 11 and 12 in FIG. 6 used to drive the wave shape cell in FIG. 4. That is to say, there will be 600 millivolts of signal swing applied from the interface cell in FIG. 6 to the base of T13 in the wave shape circuit in FIG. 4.

The two $V_{BE}$ of transistors T27 and T28 in the interface circuit in FIG. 6 are used to compensate for the two $V_{BE}$ in the differential pairs of NPN transistors in the wave shape circuit in FIG. 4. That is to say, the two $V_{BE}$ of T27 and T28 are used to voltage and temperature compensate for the $V_{BE}$ of the buffer input transistors S12 and S13 in FIG. 4 and also for the other $V_{BE}$ added by one of the NPN differential pairs S2, S3, S5, S8, S9, and S6, which are connected to the buffer transistors S12 and S13 in FIG. 4. This compensation provided by the two $V_{BE}$ of T27 and T28 in FIG. 6 is both a temperature and a voltage compensation and may be explained by the following example.

Consider first the fact that the base of T32 between resistors R61 and R60 sits at 600 millivolts plus two $V_{BE}$ above ground. Now, add to this value of 600 millivolts plus two $V_{BE}$ the plus one $V_{BE}$ of T32 and then subtract the minus one $V_{BE}$ of T33A and T33B at the output of FIG. 6. This means that nodes 11 and 12 at the emitters of T33A and T33B will be clamped at 600 millivolts plus two $V_{BE}$. This is the most negative that these two nodes 11 and 12 can swing. Now, referring to the wave shape circuit in FIG. 4, if you put node 11 at the base of S13 at 600 millivolts plus two $V_{BE}$, and then go down a $V_{BE}$ through S13 and down another $V_{BE}$ through S9, you are left with 600 millivolts across R43, and this 600 millivolts is constant over temperature as is clearly desirable.

Now consider the upper end of the ramp voltage applied to node 11 in FIG. 4. First, adding another 600 millivolts across R61 in FIG. 6 leaves us with 1.2 volts plus two $V_{BE}$ at the base of T29B. Now, subtract from this a minus $V_{BE}$ down through the base of T29B and then add a plus $V_{BE}$ up through the base emitter of T31, and this leaves us with 1.2 volts plus two $V_{BE}$ at the reference voltage output terminals 4 on the right hand side of FIG. 6. Therefore, with node 4 in FIG. 6 at 1.2 volts plus two $V_{BE}$, then subtract from this the minus $V_{BE}$ through the base emitter of S12 and subtract another minus $V_{BE}$ through the base emitter of S8 and we are left with 1.2 volts at the emitter of S8 in the wave shape cell in FIG. 4. Therefore, when node 11 at the base of S13 in FIG. 4 swings all the way down to 600 millivolts plus two $V_{BE}$, then the emitter of S5 will be at 600 millivolts. This leaves us in FIG. 4 with 1.2 volts at the emitter of S8 and with 600 millivolts at the emitter of S5, thereby developing 600 millivolts across R30 which is also supply voltage and temperature independent. This value of 600 millivolts across R30 is very important, since it determines the amount of current that S8 will pull through resistors R44 and R45B in the wave shape circuit. And this in turn as previously described determines the delta V voltage developed across R47 at the emitter of S45 in the wave shape circuit in FIG. 4.

Another important feature of the interface circuit in FIG. 6 is that if you go from the base of T29B and then through the base emitter junction of T29A, and then back up the base emitter junctions of T30A and T30B at node 46, it can be seen that the clamp voltage at node 46 should be the same as the clamp voltage at node 4 as previously described. Now, if the voltage level at node 46 was exactly the same as the voltage level at node 4, one could not guarantee a solid switching action out of the wave shape cell of FIG. 4. For this reason, a slight offset voltage has been programmed in the circuit of FIG. 6 in the following manner: This slight offset voltage is provided by making transistor T29A a much larger device than T29B. Thus, by making T29A a much larger device than T29B, there is a much lower $V_{BE}$ drop through T29A than through T29B for the same current density therein, thereby ensuring the above solid switching action.

Thus, the clamp voltage on nodes 11 and 12 will be slightly higher than clamp voltage on nodes 4 by the amount of this $V_{BE}$ differential offset voltage provided by the larger NPN device of T29A. Thus, the above offset feature ensures that the differential NPN transistor pairs such as S2 and S3 in the wave shape cell in FIG. 4 do not share current when the node 11 at the base of S13 in FIG. 4 if ramped high, and this also ensures that S2 turns on and S3 turns off to make a good solid switch when the ramp voltage at node 11 at the base of S13 ramps high. Thus, you want node 11 to ramp up high enough so that S2 turns on and turns S3 off, and that S9 similarly turns on and turns off S6. This would not happen if you did not take node 11 up above node 4 as provided herein by the above built in offset $V_{BE}$ feature provided by T29A in the interface circuit of FIG. 6.

Referring now to the connection of the differential pair S9 and S6 in the wave shape circuit of FIG. 4, as node 11 swings high, S9 will turn S6 off. Previously, S6 was pulling current out of node 46. Node 46, in turn, is connected to the bases of T30A and T30B in the interface circuit. The voltage at node 46 now pulls down on the bases of T30A, T30B, and T29A, and if the current is now backed off node 46, then resistor R68 will pull up on node 46 until the voltage at node 46 approaches the voltage at the emitter of T36 in the interface circuit. Now, consider where T36 is strategically located in FIG. 6. The base of T36 is connected directly at the top of resistor R62 in the previously described bias string including R62, R61, and R60. Thus, the base of T36 is higher than the base of T29B by a certain number of millivolts and proportional, of course, to the 2.5 kilohm resistor value of R62, or approximately 500 millivolts higher than the base of T29B, and 500 millivolts higher than the voltage on node 4.

Now, if you go from the voltage at the top of resistor R62 and then down through the base emitter junction of T36 and then across the resistor R68, and then back up through the base emitter junctions of T30A and T30B to the two nodes 11 and 12, respectively, then this says that nodes 11 and 12 will clamp at 500 millivolts higher than they would otherwise normally do. Now, here is the key to the novel timing function of FIG. 6: As you are turning off one wave shape circuit or cell 44 or 45, you will start to turn on the other wave shape circuit or cell, thereby turning off S6 in FIG. 4 and node 46 in one wave shape cell and also turning off a similarly located transistor S6 and node 46 in the other wave shape cell. So that as long as the two wave shape cells, i.e. 44 and 45 in FIG. 1, are dynamically driven out of phase, there will always be current flowing into one or the other of the two nodes 46 shown in FIG. 6 and connected respectively to the corresponding nodes 46 in each of the wave shape cells as shown in FIG. 4.

If, however, you stop transmitting and both output stages in FIG. 1 are turned off, there will be no current pulled out of either of the nodes 46 shown in FIG. 6. At this point, the reference voltage for nodes 11 and 12 will be allowed to float up to their clamp voltage of 500 millivolts. That is to say, these nodes 11 and 12 will be clamped at 500 millivolts higher than the voltage at the reference nodes 4. Now, when both channels of the transmitter have been off and it is now desired to turn one of the two wave shape channels on, the ramp voltage at node 11 at the base of S13 in FIG. 4 must ramp down below the 500 millivolts at node 4 before the particular wave shape channel at S13 in FIG. 4 will turn on. This ramping action translates into a controllable time delay by the amount of capacitance on node 11 and proportional to the voltage across resistor R62 in the interface circuit of FIG. 6.

This voltage across resistor R62 in FIG. 6 has been set to be about 500 millivolts, but it could have been set to other levels such as 400 or 600 millivolts if desired in order to control the above time delay in accordance with certain transceiver applications. This time delay is used to establish the above described sync pulse width and thereby establish the proper timing and width for the first transmitted pulse cycle. Thus, the above feature ensures that the first pulse generated by one of the two wave shape circuits is not narrower or wider than the above described specification of 1500 plus or minus 25 nanoseconds. If the first pulse is out of this specification range, then every other succeeding pulse will also be out of this specification range, since each succeeding pulse cannot be generated until the other wave shape channel has turned off. This is the key to the operation of the novel sync timing circuit in FIG. 6.

There are still other novel features of the interface circuit shown in FIG. 6 which should be noted. These include the fact that the biasing for the wave shape cell is also controlled by the voltage at the bases of the PNP transistors T37 and T38 and connected as shown at the emitter of T39. The collector of T37 goes into one wave shape cell through node 44B, and the collector of T38 goes into another wave shape cell through node 44A. The current level that these PNP transistors T37 and T38 are biased to conduct is controlled by the voltage at the base of T39 which is connected to node 46. Thus, since the $V_{BE}$ at T39 on the one hand, and the $V_{BE}$ at T37 and T38 on the other hand cancel each other, the voltages across R61 and R60 are equal to the voltage at nodes 46. Now, consider the fact that the top ends of resistors R60 and R61 are driven by the emitter of PNP transistor T41. Adding to the voltage of the emitter of T41 (the $V_{BE}$ of T41) and then subtracting the $V_{BE}$ of T40 leaves a voltage at the emitter of T36 equal to the voltage at the tops of resistors R60 and R61.

Recall now that the voltage at the bottoms of resistors R60 and R61 is equal to the voltage at nodes 46. When one of the two wave shape channels in FIG. 4 turns off, this means that node 46 will float up to the potential at the emitter of T36, thereby collapsing the voltage across resistors R60 and R61 and backing off on the bias current through these resistors. Thus, this produces a side benefit of cutting back on the standby current drain in each of the two wave shape cells in FIG. 4. Thus, bias transistors T37 and T38 in the interface circuit in FIG. 6 do not now turn completely off, but they are shut way back and draw just a trickle of current upon the collapse as described above and as a function of the voltages across their emitter resistors R60 and R61.

Figure 7:
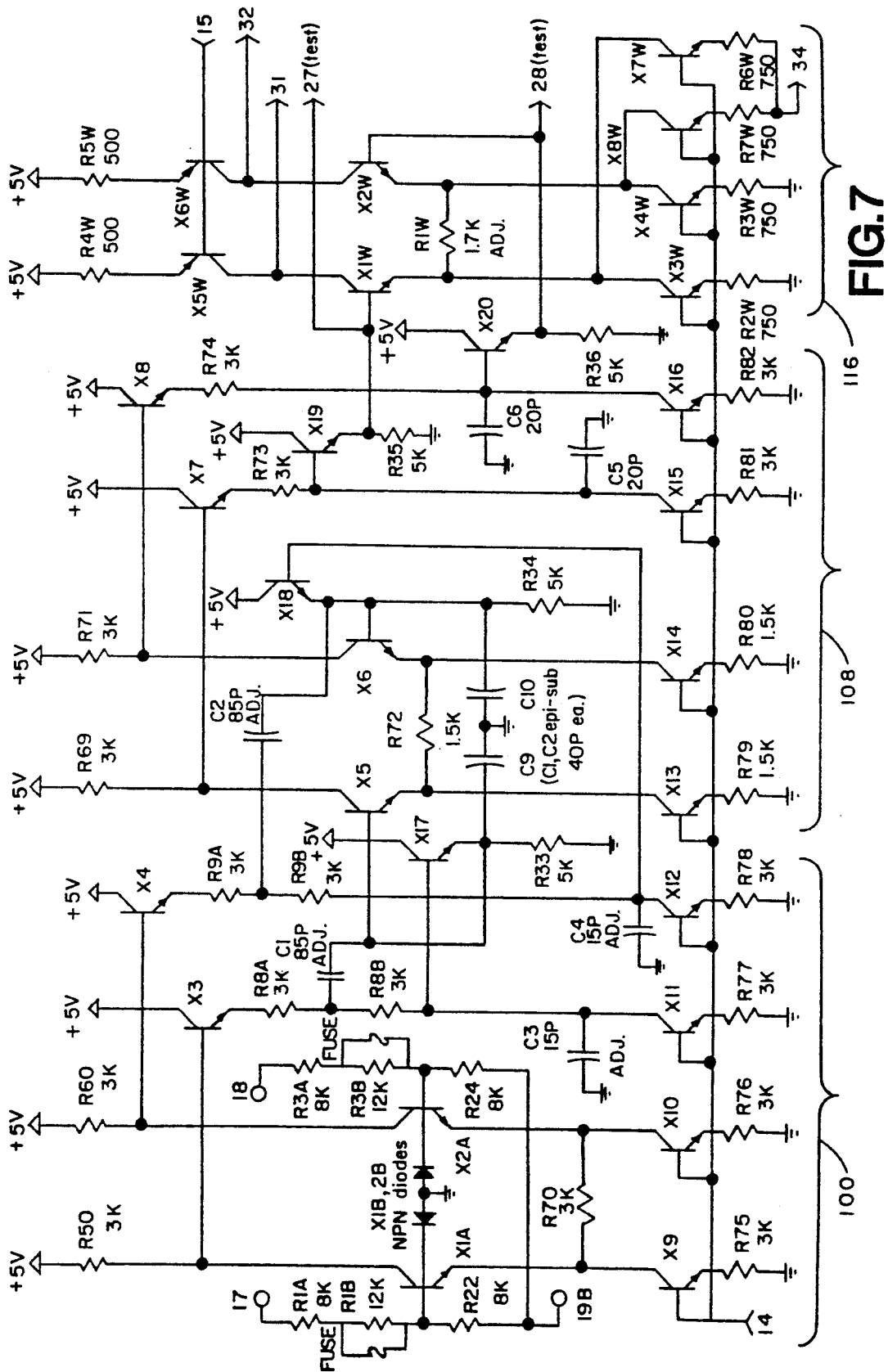
FIG. 7 is a schematic circuit diagram showing the electronics for the preamplifier stage, the filter stage and the window comparator stage of the receiver shown in the functional block diagram in FIG. 2. This circuitry includes a DC coupled differential input/differential output monolithic receiver section connected to drive a balanced differential filter and a differential integrated window comparator stage.

Referring now to FIG. 7 where "X" denotes a transistor, there is shown the monolithic integrated circuitry which forms the differential input/differential output amplifier stage 100 in FIG. 2 which is connected to drive a balanced differential filter stage 108 therein. The balanced differential filter stage 108 is in turn connected to drive a differential window comparator stage 116, and the outputs of the differential window comparator stage 116 are in turn connected to the TTL output logic driver stages 126 and 128 shown functionally in FIG. 2 above and shown in schematic detail in FIG. 9 below.

In describing the operation of the receiver circuit shown in schematic diagram in FIG. 7, certain ones of the individual transistors in this circuit will be called out and identified so as to set the background for describing the amplification, filtering and comparison functions of the three cascaded stages 100, 108, and 116, respectively. Thereafter, the circuit operation of these three stages 100, 108, and 116 will be described in terms of how a differential input signal from the bus lines 92 and 94 in FIG. 1 and appearing on input terminals 17 and 18 of the differential amplifier stage 100 in turn generates a differential output signal on lines 31 and 32 from the differential window comparator stage 116.

The NPN transistors X9, X10, X11, X12, X13, X14, X15, and X16, together with their emitter current limiting resistors R75, R76, R77, R78, R79, R80, R81, and R82, respectively, are constant current sources which operate to set up the DC bias for both the differential amplifier stage 100 and the balance differential filter stage 108. Similarly, the NPN transistors X3W, X4W, X8W, and X7W together with their emitter current limiting resistors R2W, R3W, R7W, and R6W set up the DC bias levels in the output window comparator stage 116. The window comparator 116 operates as a level detection circuit, and the function of the window comparator stage 116 is to, among other things, generate an output differential signal on lines 31 and 32 when it determines that the differential input signal applied to the input terminals 17 and 18 of the differential amplifier stage 100 is a true and valid level differential signal. The polarity of the signal coming into the window comparator stage 116 can be in either direction, and it is this dual polarity function to which the term "window comparator" refers.

The constant current source transistors X9 and X10 feed the differentially connected input transistors X1A and X2A in the first, amplification stage of the differential amplifier 100, whereas the next two constant current source transistors X11 and X12 feed the output buffer applifiers X3 and X4 in the second stage within the differential amplifier section 100. Similarly, the current sources X13 and X14 bias up the differentially connected transistors X5 and X6 in the filter stage 108 of the monolithic circuitry, and current sources X15 and X16 bias up the output emitter follower buffer amplifiers X7 and X8 in the second or output stage within the balanced differential filter section 108 which operate to drive the window comparator stage 116.

The above described constant current source transistors X9 through X7W in the lower section of FIG. 7 not only set up the DC bias levels in the three stages 100, 108, and 116 in the receiver section of the transceiver, but they also are the vehicle by which control of the DC level translation between and within the tandem connected stages 100, 108, and 116 is achieved in the manner described below. Thus, the monolithic circuitry in FIG. 7 requires this DC level translation, the present invention is embodied in an all-DC coupled circuit that does not require any large capacitors for coupling between stages. Such large capacitors would have to be formed outboard on the L85 receiver chip, and this requirement as eliminated herein will not allow all of the advantages as outlined above to be achieved for the all monolithic transceiver described in the present application.

Referring now more specifically to the differential input/differential output amplifier stage 100, the differentially connected input transistor pair X1A and X2A is connected through a pair of load resistors R50 and R60, respectively, to the +5 volt supply terminal. These transistors are further connected at their emitters to a common gain-controlling resistor R70 which controls the denominator of the gain equation for the amplifier stage 100. The differential amplifier stage 100 is an open loop amplifier stage having no feedback around it, and the gain of this stage 100 is set by the resistor loads R50 and R60 divided by the resistor in the denominator, R70, which is connected in series with the dynamic emitter resistance of the transistors X1A and X2A. The dynamic emitter resistance of these transistors X1A and X2A depends upon the level of current flowing through these transistors, and this level of current is set by the current source transistors X9 and X10 previously described. The current source transistors X9 and X10 also set the voltage levels across the load resistors R50 and R60, and the common emitter resistor R70 connected between the emitters of Q1A and X2A is used so that the differential amplifier stage 100 can handle both large and small signal swings which would not be otherwise possible by connecting the emitters of these two input transistors X1A and X2A directly together.

The NPN diodes X1B and X2B are clamping devices which are used to prevent the signal swings on the bases of the transistors X1A and X2A from going to unsafe levels when these transistors are overdriven. By definition, these two input transistors X1A and X2A will be overdriven every time the transmitter is operating, since the transmitter and the receiver shown in FIGS. 1 and 2 above are operating on the same output coil. Thus, every time the transmitter is in use, the receiver will see some very large signals which must be protected against by the clamping action of the diodes X1B and X2B. Thus, the bases of X1A and X2A will be prevented from going no further below ground than the one diode drop of these clamping diodes X1B and X2B. On the other hand, the other end of the signal swing of the overdriving transmitter signal will be clamped through the base-collector junctions of the NPN input transistors X1A and X2A and through the base-collector junctions of the output buffer transistors X3 and X4 to the plus five (+5) volt supply voltage. Thus, it is seen that all of the transistors X1A, X2A, X3, and X4 are biased to the five volt supply level in this stage, so that the DC bias levels at all points in this stage 100 will track bias variations that may occur within this five volt DC supply voltage.

The differential input/differential output amplifier stage 100 includes an input resistor network comprising resistors R1A, R1B, and R22 on one side of the transistor X1A and a resistor network comprising resistors R3A, R3B, and R24 on the other side of the input amplifier stage at the base of X2A. The resistors R1B and R3B basically are a short when a DC supply voltage of five volts is used, but when the circuit shown in FIG. 7 is used with a different transformer structure providing larger incoming signal swings, more input impedance is required. Therefore, the two additional resistors R1B and R3B will need to be added to the input differential amplifier stage. Hence, the notation "fuse" or "12K" is used on the schematic diagram in FIG. 7 to denote either a short or a 12 kilohm resistor for components R1B and R3B. This latter feature enables a change in input impedance to the amplifier stage 100 to be adjusted by means of the variable components R1B and R3B without the necessity for making numerous other changes in the circuit to readjust a corresponding large number of threshold voltages therein.

The input terminals 17 and 18 to the input differential amplifier stage 100 are connected to the transformer of the receiver section of the transceiver, and the terminal 19B is the bias reference point for the above input resistive networks for input terminals 17 and 18. If the transformer is referenced to ground, then the input terminals 17 and 18 will be receiving signals which vary around ground potential, and the terminal 19B will be bonded out to the five volt supply. In this situation, it is necessary to level translate from the transformer up to a useable DC voltage for the correct biasing of X1A and X2A. If on the other hand the transformer is referenced to the five volt supply, then the input terminals 17 and 18 will be receiving signals varying around the five volt supply voltage. In this situation, the bias reference terminal 19B is grounded, thereby providing a significant degree of flexibility for the above two different biasing operations for the transformer to which the differential input terminals 17 and 18 will be connected.

Another significant feature of the input differential amplifier stag 100 is that the input transistors X1A and X2A, together with their matched loads R50 and R60, their matched current source transistors X9 and X10 and their matched resistive input resistor networks previously described ensures that this input stage operates with a significant amount of common mode rejection. The common mode variations seen by the two input transistors X1A and X2A take on two subtle differences in meaning: one has to do with the common mode signal into the amplifier, and the other has to do with the common mode signal within the receiver system itself. The input differential amplifier stage 100 provides excellent common mode rejection for both types of signal level variations.

The collector outputs of the differentially connected transistors X1A and X2A are buffered by the emitter follower buffers X3 and X4, respectively, and the transistors X3 and X4 feed the second differential filter stage 108 of the receiver section of the transceiver. The differential transistor pair X5 and X6 in the filter stage 108 is connected as shown with the RC filter networks connected around these transistors. These RC filter networks are operative to give a two pole roll-off and low pass filtering which is operative to roll-off high frequencies out beyond a predetermined roll-off frequency. These high frequencies begin to roll-off somewhere in the vicinity of one megahertz.

The capacitors C1, C2, C3, and C4 in the low pass filter network are MOS onboard capacitors formed on the monolithic die, and capacitors C9 and C10 are parasitic epitaxial layer-substrate capacitances within the monolithic die, and they form part of and are integral with the overall MOS capacitor structure. That is, the parasitic epi-substrate capacitances C9 and C10 are lumped together with the MOS capacitances C1 and C2, respectively, for the purpose of establishing the RC filter and frequency roll-off characteristics. The capacitors C9 and C10 are driven by the low emitter impedances of the emitter followers X17 and X18, respectively, so that C9 and C10 do not have much effect on the overall frequency response of the circuit. The filter capacitors C1 and C2 are connected with the polarities indicated to provide balanced filtering for the balanced differential filter stage 108 which is, as previously indicated, a balanced differential input/differential output stage.

The input amplifier stage 100 is connected by way of its output buffer transistors X7 and X8 to provide a balanced differential input signal to the following window comparator stage and thus reduce the number of devices otherwise required by the window comparator stage 116 in order to detect differential signals of either polarity. If for some reason the differential filter stage 108 had been connected as a differential input-to-single-ended output stage, then this circuit design would mean that two comparators, rather than one, would have been required to look at each polarity that had to be detected in the window comparator stage 116. Thus, by maintaining differential input/differential output signal processing all the way through the first two stages 100 and 108 in FIG. 7, a differential input, differential output window comparator was used in order to cut down on the complexity of the window comparator stage 116. This is an extremely important feature of the present invention.

Referring again to the input connections for the balanced differential filter stage 108, this stage is driven by the output resistors R8A and R8B connected to the input of transistor X17 and the output resistors R9A and R9B connected to the input of transistor X18. In addition, the differentially connected transistor X5 is connected through the filter capacitor C1 to the intersection of resistors R8A and R8B at the output of the buffer transistor X3, and the differentially coupled transistor X6 is connected through the filter capacitor C2 to the intersection of resistors R9A and R9B at the output of the buffer transistor X4. Furthermore, an adjustable capacitor C4 is connected between the resistor R9B and ground potential and an identical capacitor C3 is connected between the resistor R8B and ground, so that the filtering action for the differential filter stage 108 is completely balanced.

The resistors R8A, R8B, and the capacitors C1 and C3 form a two pole, low pass filter network at one side of X5, whereas resistors R9, R9B, and capacitors C2 and C4 also form a two pole, low pass filter network at one side of X6 of the differentially connected pair of filter transistors X5 and X6. Transistor Q17 has its base connected to resistor R8B and provides a low impedance output for the feedback signal for the feedback side of C1. Thus, C1 comes off of the emitter of X17, and the emitter of Q17 also feeds the base of X5 in addition to being connected through resistor R33 to ground. In a similar fashion, the emitter output of X18 is connected back through the low pass filter network capacitor C2 to the tap point of filter resistors R9A and R9B, and the emitter of X18 also provides the necessary base drive to the base of X6. Similarly, the emitter of X18 is connected through a current limiting resistor R34 to ground potential. Each of the above described low pass filters has a gain of no more than zero db, or a maximum gain of 1.

The second differential transistor pair X5 and X6, like the previous differential pair X1A and X2A, has balanced loads R69 and R71 which source current through X5 and X6, respectively, into the balanced NPN current sources X13 and X14. The resistor R72 which is located between the emitters of X5 and X6 controls the denominator of the gain equation for the differential filter stage 108. Also, like the previous amplifier stage 100, the differential filter stage 108 is an open loop differential amplifier. Thus, the filter stage 108, in combination with the previous differential amplifier stage, 100 provides two stages of gain and the appropriate DC level translation and also the required RC filtering of the signal which is applied to the window comparator stage 116. The differential outputs of the second, filter stage 108 are also buffered out of this stage 108 through the emitter follower transistors X7 and X8 which are connected as shown through their output emitter resistors R73 and R74, respectively, into a pair of output emitter follower driver transistors X19 and X20 in the window comparator stage 116.

The resistors R8A, R8B, R9A, and R9B in the above described RC filter networks in stage 108 are not only important for determining the RC filter characteristics of these networks, but they are also important for establishing the proper DC bias levels for the balanced differential filter stage 108. Similarly, the load resistors R69 and R71 in stage 108 set the DC bias levels at the bases of X7 and X8 just like the current source transistors X13 and X14 set the DC bias levels for the differentially connected transistors X5 and X6. This novel circuit connection is important because all of these differentially connected transistors in the filter stage 108 as well as those in the input amplifier stage 100 and in the window comparator stage 116 are all biased to be linear and active during the signal excursions of the differential signals received at the input terminals 17 and 18 of the receiver section of the transceiver. Additionally, the voltage dropped across the load resistors R50, R60, R69, and R71 in the first two receiver stages 100 and 108 determine the maximum signal swing one will see out of these two tandem connected stages 100 and 108. This signal swing has to be large enough to allow true signals to be appropriately processed, and secondly this allowable and controlled signal swing limits the voltage excursions of the above amplifier stages when they are overdriven. Furthermore, all of this is accomplished with the use of an all-DC coupled scheme and without any AC interstage capacitive coupling whatsoever.

The output signals of X7 and X8 are level translated down through resistors R73 and R74 by the current drawn through these resistors R73 and R74 by the matched current source transistors X15 and X16. These resistors R73 and R74 level translate the signal back into a useable range so that it may be applied differentially to the window comparator stage 116. In addition, the resistor R73 working into capacitor C5 and the resistor R74 working into capacitor C6 provide some additional low pass filtering for this circuit arrangement. This additional low pass filtering is necessary to take care of some additional high frequency filtering requirements for the L85 receiver. Thus, whereas the previously described filter networks between stages 100 and 108 were two pole filter networks to provide some degree of roll-off at frequencies out beyond one megahertz, the additional low pass filter networks R73 and C5 and R74 and C6 provide an additional pole of roll-off at even higher frequencies as may become necessary from time to time during the circuit operation.

The nodes at the collectors of the current sources X15 and X16 are buffered through the differentially connected transistors X19 and X20, and the emitters of the emitter followers X19 and X20 provide the signals that will drive the window comparator stage 116. The denominator gain for the emitter coupled pair X1W and X2W is set by the common emitter resistor R1W, and resistor R1W is adjustable so that the threshold voltages at the inputs of X1W and X2W can be varied. Thus, the resistor R1W may be trimmed by the use of fuseable links as indicated in the drawings if necessary.

It should be pointed out here that the NPN current source transistors X3W, X4W, X8W, and X7W, as well as all of the other previously described lower current source transistors X9 through X16, are biased on the left hand side of FIG. 7 at terminal 14 and are there referenced to the bandgap voltage of silicon. Similarly, the upper current source transistors X5W and X6W at the collectors of X1W and X2W are also biased and referenced to the bandgap voltage of silicon at reference terminal 15. Thus, all of these current source transistors identified above are both supply voltage independent and temperature independent as will be appreciated by those skilled in the art. Thus, the reference voltages at both nodes 14 and 15 are derived from the bandgap voltage of silicon, BG, and various DC bias reference voltage circuits (not shown) may be used for this purpose within the skill of the art to which this invention pertains.

Turning now to the differential switching operation of the output window comparator stage 116, the current sources X3W and X4W set the emitter currents for the differential pair X1W and X2W, and these currents are reflected in the collectors of X1W and X2W. With no incoming signal applied to the window comparator stage 116, and assuming no DC off-sets, there will be a zero differential voltage between the inputs 27 and 28 at the bases of X1W and X2W. However, the DC level that the bases of X1W and X2W will be at some controlled DC voltage that allows all of these transistors to be active and in a proper bias condition for linear operation upon receipt of a differential signal of either polarity at transistors X1W and X2W. With a zero differential signal applied to the window comparator stage 116, the collector currents of X3W and X4W will be equal to the emitter currents from X1W and X2W. At the same time, the currents out of the current sources X5W and X6W are also equal and matched, but they are greater than the currents being pulled by X1W and X2W. Therefore, what happens in this situation is that nodes 31 and 32 both want to float high, and they do float high, but they are clamped by the voltages on an adjacent strobe interface cell to be described below with reference to FIG. 8.

Figure 8:
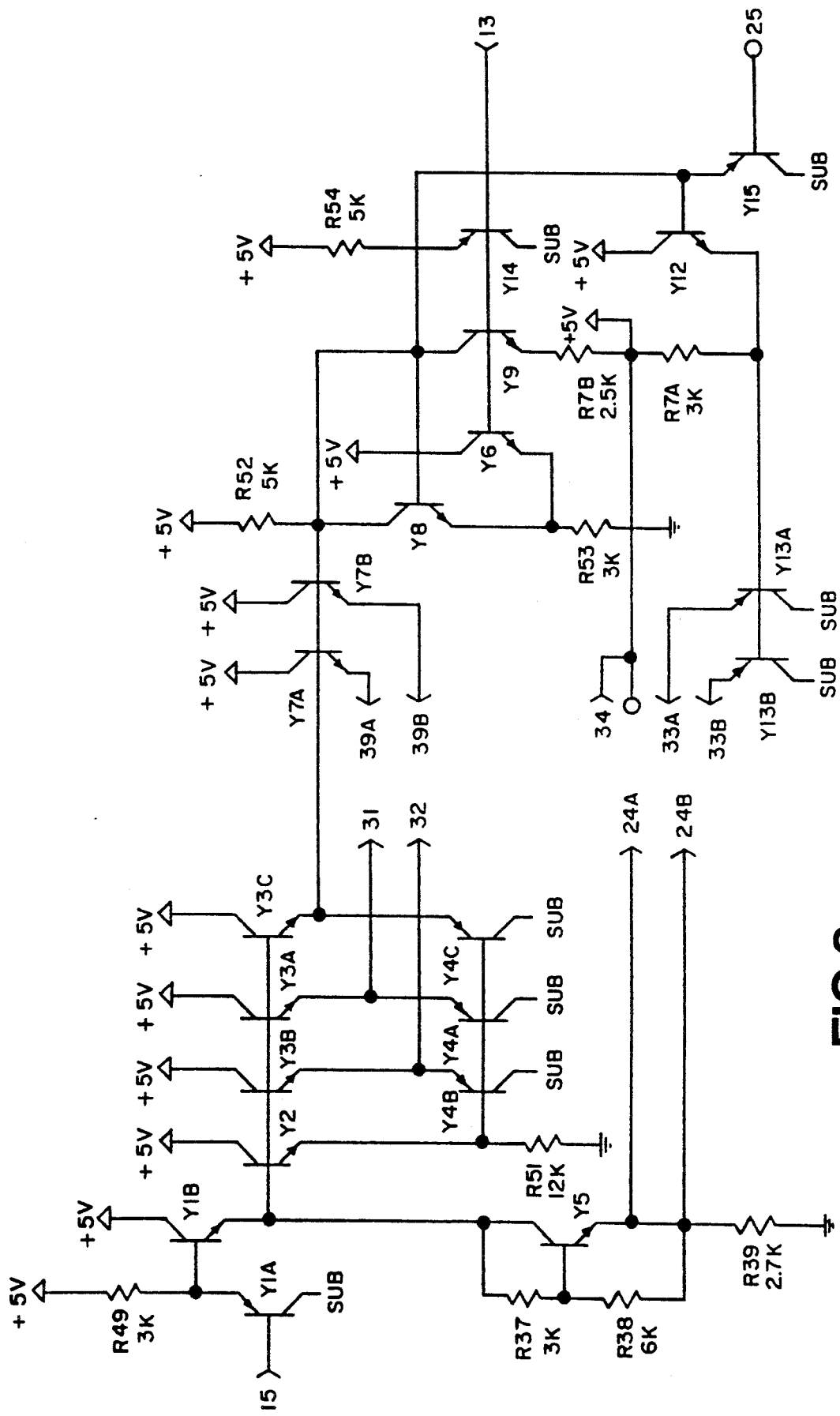
FIG. 8 is a schematic circuit diagram of the L85 strobe cell which forms part of the receiver section of the transceiver and which is used to control the flow of digital data from the window comparator stage of FIG. 7 to the TTL output stage of FIG. 9 below.

Referring now to the L85 strobe cell and circuitry shown in FIG. 8 where "Y" denotes a transistor, a brief explanation at this point of a portion of this cell will be helpful in describing how the reference voltage node 15 in FIG. 7 is DC biased and controlled to properly clamp the voltage swings at the output terminals 31 and 32 at the collectors X1W and X2W and X5W and X6W in the window comparator stage 116. Then, later on in the specification, a more complete description of the strobe cell FIG. 8 will be provided.

The reference voltage node 15 in the upper left hand corner of FIG. 8 is also referenced to the bandgap voltage and is buffered up through one $V_{BE}$ Y1A and down one $V_{BE}$ through Y1B, so that the emitter of Y1B sets up the DC biasing on the NPN emitter followers Y2, Y3B, and Y3A and also the bias on PNP transistors Y4B, Y4A, and Y4C. Now, since the nodes 31 and 32 are connected from the collectors of Y1W and Y2W in the window comparator stage 116 to the emitters of Y3A and Y3B, respectively, then when node 31 is pulling current from Y3A. Therefore, the transistor Y3A will clamp this voltage at node 31 at one $V_{BE}$ below the reference voltage at node 15. Similarly, if node 32 is pulling current out of Y3B, then the base emitter junction of Y3B will clamp the voltage at node 32 at one $V_{BE}$ below the reference voltage at node 15.

On the other hand, if current is forced into node 31, then Y4A will conduct, and the base of Y4A will also be at one $V_{BE}$ below the base of Y1A at reference node 15. So that with Y4A conducting, the voltage on the emitter of Y4A and at node 31 will be equal to the reference voltage at node 15. Thus, for an AC signal first pulling current and then sourcing current at nodes 31 and 32, you will get a one $V_{BE}$ voltage swing at the two nodes 31 and 32. That is, when you are sourcing current into node 31, the voltage at this node will be clamped at the reference voltage of node 15, whereas when you are pulling current out of node 31, the voltage swing thereat will be clamped to approximately one $V_{BE}$ below the reference voltage at node 15. The same action is true of node 32 which will also be voltage-swing limited between the reference voltage at node 15 and one $V_{BE}$ below the reference voltage at node 15. Now, this strobe cell circuit in FIG. 8 interfaces to nodes 31 and 32 in the differential window comparator stage 116 in FIG. 7, and it thereby limits and controls the signal swing at these nodes 31 and 32 in the window comparator stage 116. That is to say, the signal swing at these two nodes 31 and 32 in FIG. 8 is located between the reference voltage at node 15 and one $V_{BE}$, or one $V_{BE}$ absolute.

Referring again to the strobe cell in FIG. 8, the emitter of Y1B is connected to a voltage multiplier circuit consisting an emitter follower Y5 and resistors R37, R38, and R39 connected as shown to Y5. Thus, proceeding from the emitter of Y1B which sits at the voltage of node 15 and going through R37 and Y5, this causes the voltage at node 24A to set up at 1.5 $V_{BE}$ below the voltage at node 15. That is, there is 1 $V_{BE}$ across R38 and one half (½) $V_{BE}$ across R37, so that the emitter of Y5 is a buffered 1.5 $V_{BE}$ below node 15. This latter feature is significant in how we subsequently interface between the window comparator stage 116 and the TTL output stage described below with reference to FIG. 9.

Figure 9:
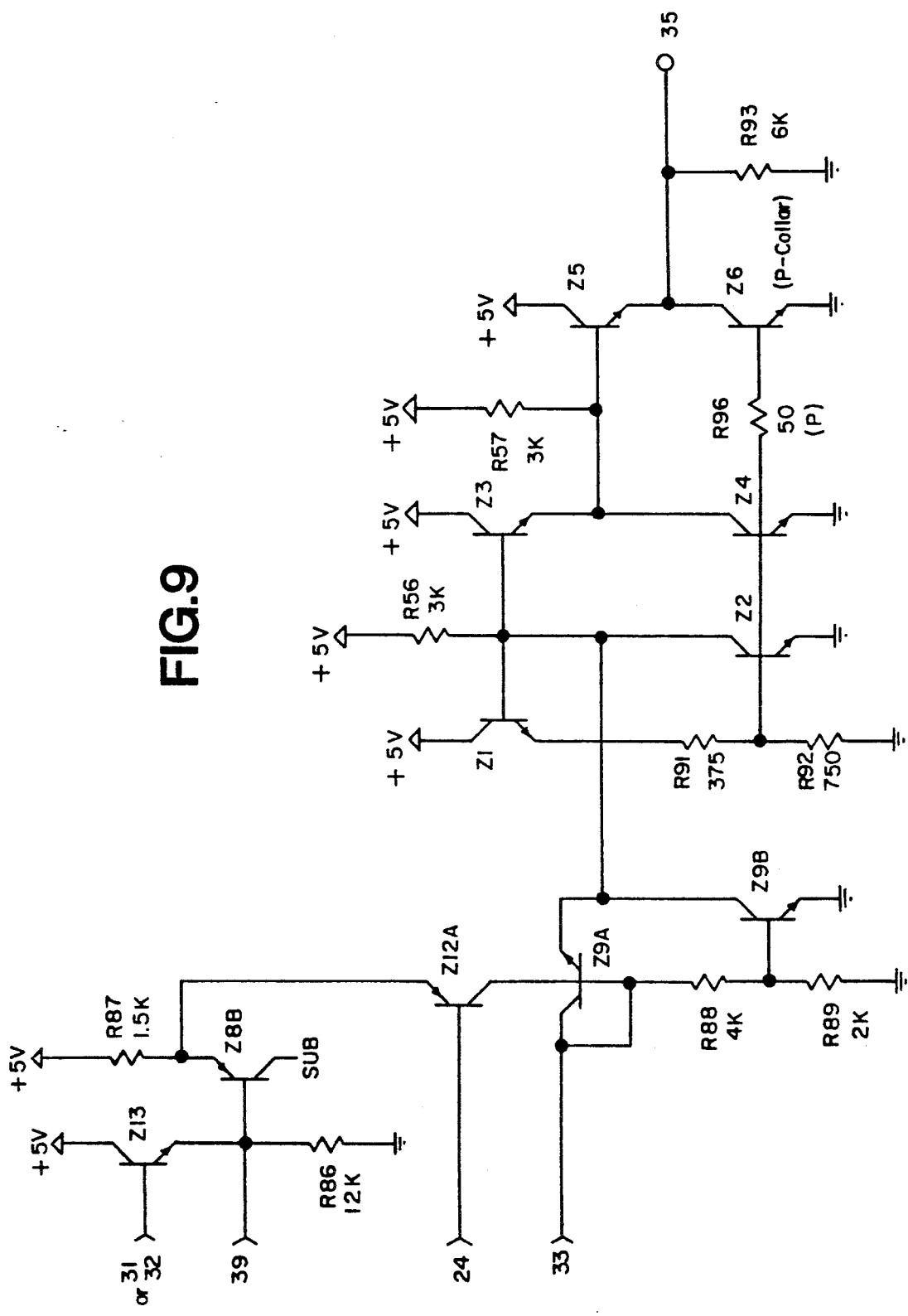
FIG. 9 is a schematic circuit diagram of the DC level translator and output transistor-transistor-logic (TTL) driver stages shown in FIG. 2.

Referring now to the right hand side of the strobe cell in FIG. 8, the strobe input is applied to node 25 as shown, and depending upon whether this node is high or low in turn controls whether or not you allow the window comparator outputs to pass through to the TTL output in FIG. 9. This function will be described in somewhat more detail below, but the present discussion is being limited mainly to the left hand side of FIG. 8 in order to fully understand the clamping action at nodes 31 and 32 in the window comparator stage 116. Thus, if the strobe circuit in FIG. 8 is enabled by a signal applied to the input node 25, then the receiver signals will pass to the TTL output stage in FIG. 9. On the other hand, if a signal on strobe input terminal 25 disables the strobe cell in FIG. 8, then signals will be blocked from getting through to the TTL outputs in FIG. 9. This is essentially the function of the entire right hand side of the schematic in FIG. 8.

Referring again to the window comparator stage 116 in FIG. 7, since the currents out of X5W and X6W are greater than the currents into X1W and X2W, then the output nodes 31 and 32 will float upward and be clamped by the strobe cell at the node voltage on node 15. However, the voltage at node 15 is also the base voltage on the current source transistors X5W and X6W, so that nodes 31 and 32 are clamped at approximately zero bias.

Now consider the fact that if node 34 in the lower right hand corner of FIG. 7 is grounded, then the current source transistors X8W and X7W will be placed in parallel with current sources X3W and X4W. This in turn sets the currents in the lower current sources X3W, X4W, X8W, and X7W to be greater than the currents out of the current sources X5W and X6W in the upper portion of the window comparator stage 116. Therefore, in this condition the currents into the collectors of X1W and X2W will be greater than the output collector currents of X5W and X6W. This action in turn will cause nodes 31 and 32 to fall instead of rise as in the previous case. Thus, the nodes 31 and 32 will now fall until they are clamped by the NPN transistors X3A and X3B in the strobe cell in FIG. 8 previously described. This clamping will be one $V_{BE}$ down below the voltage at reference node 15.

The reason that this latter feature is important to understand is that by either grounding node 34 in FIG. 7, or by letting node 34 float, we are changing the resting polarity of the outputs 31 and 32 of the window comparator 116 from either being positive or negative or vice versa. This requirement is necessary in order to change from a well known Smith output configuration to a well known Harris output configuration. The Smith and Harris configuration terminology refers to whether or not the outputs in a MIL-STD-1553 transceiver are sitting high or sitting low when no signal is being received. That is, this notation describes what resting polarities are present at the outputs of the receiver section of the transceiver when no input signals are coming in. Thus, the present invention is able to accommodate both types of these output configurations, namely the Smith and Harris types. In addition, the current sources X3W, X4W, X8W, and X7W have been designed so that by either letting node 34 float high (or connecting it to the +5 volt supply) or by connecting it to ground, one or the other of the Smith and Harris configurations may be selected without having to change any of the threshold voltages within the circuitry of FIG. 7. This is yet even one more extremely novel feature of the present invention.

Referring again to the window comparator stage 116, assume that X8W and X7W are now disconnected from the circuit and that nodes 31 and 32 at the output of the window comparator stage 116 are allowed to float high. Now we need to produce enough current through R1W to generate the desired differential signal output condition at the output nodes 31 and 32. For example, suppose that the differential input signal into the comparator 116 is such that X19 drives the base of X1W high and that X20 drives the base of X2W low. This switching action will in turn drive the emitter of X1W high and the emitter of X2W low. This will happen in a large enough signal magnitude and with a sufficiently high current flowing across R1W to produce a corresponding increase in current from the output of X5W which will start to pull node 31 down. At the same time, node 32 will not move, and it will still want to stay high. This action will back off current in transistor X2W, forcing more current out of node 32 and causing node 32 to stay high. At the same time, node 31 is starting to come down, and this is how we are able to obtain a desired level differential output signal to propagate into the TTL output stage in FIG. 9.

Now, consider the situation when the differential signal on nodes 31 and 32 swing in the opposite direction from that described above. When this happens, the base of X2W is being driven high and the base of X1W is being driven low, and this in turn will pull down on node 32 while node 31 remains high. Now, there is a certain level of DC threshold voltage that is required across the common emitter resistor R1W in order to produce the above differential switching operation at the output nodes 31 and 32. Thus, for one polarity of signal, the signal level at node 31 will move and for the other polarity signal, the signal level at node 32 will move in the window comparator stage 116 of FIG. 7.

Now, if node 34 is now grounded and with nodes 31 and 32 starting out low instead of high as previously described, the same rationale is still going to apply. That is to say, there still needs to be enough differential signal across R1W to either cause node 31 to rise or to cause node 32 to rise. In other words, if node 27 relative to node 28 is positive enough, then instead of causing node 31 to fall you will cause node 32 to rise. Whereas earlier we caused node 32 to stay high while pulling node 31 down, now we are now starting out with both nodes 31 and 32 down, and then forcing node 31 to stay down while allowing node 32 to rise. This is the way the window comparator sets up. Thus, the above described novel circuitry in stage 116 of the window comparator provides all of the functions that it would normally take two individual window comparators to accomplish, and this is yet another extremely novel feature of the present invention.

Referring now to FIG. 9 where "Z" denotes a transistor, this TTL circuit represents one TTL output stage which is connected to node 31 in the window comparator stage 116 of FIG. 7, whereas an identical TTL output circuit such as that shown in FIG. 9 is connected to the other differential output node 32 in the window comparator stage 116. Since these two TTL output stages are identical to the schematic shown in FIG. 9, we need only describe here the switching operation of the TTL output stage shown in FIG. 9. Thus, for one polarity of differential output signal from FIG. 7, you will produce an output from a TTL output stage as shown in FIG. 9 from an output signal at node 31. For the opposite polarity differential signal applied to the window comparator stage 116, you will produce an output signal from an output stage identical to the TTL output stage of FIG. 9 and connected to the other output terminal 32 in window comparator stage 116.

Assume now that the right hand side of the strobe circuit in FIG. 8 and the disabling function thereof have been implemented in the Smith configuration with the node 34 therein connected to the +5 volt supply. Consider this together with the fact that each of the nodes 31 and 32 in FIG. 9 is connected to the base of an identical NPN transistor Z13 in the upper left hand corner of this figure. The emitter of Z13 in turn drives the base of a PNP transistor Z8B, and the node 39 at the base of Z8B is connected to either terminal 39A or 39B in the strobe circuit FIG. 8 and becomes part of the strobe function as will be described below. Thus, operating in Smith configuration, node 39 can be driven high and held high, so that no matter what else happens at node 31, the emitter of Z13 will be held high and will block any signal from passing through Z13. In this manner, the enabling or disabling signal on node 39 from the strobe circuit in FIG. 8 is operative to enable or disable the TTL output stage in FIG. 9.

The second method of implementing the strobe disabling function is by using well known Harris configuration where the node 34 in the strobe circuit of FIG. 8 is connected to ground. This is done by the application of an appropriate level signal at node 33 into the collector of Z9A. By holding node 33 low, then no matter what else happens at transistors Z13 and Z8B, no signal can propagate through Z9A to the output node 35 of the TTL output stage. Thus, the TTL output stage in FIG. 9 can additionally be disabled in this manner by the application of an appropriate level enabling or disabling signal to the control node 33. And, the particular way the circuit of FIG. 9 is disabled through either the application of a signal at node 33 or the application of a signal at node 39 depends upon whether you want the output node 35 of the TTL output circuit to rest high (Smith configuration) or to rest low (Harris configuration). The latter feature in turn makes the circuit of FIG. 9 compatible with either the selected Harris configuration or the selected Smith configuration as previously described. On the other hand, the voltage at node 34 (FIG. 7) is also controlled by the strobe cell in FIG. 8 and is also part of the Smith or Harris determination as was previously indicated with respect to FIG. 7. Therefore, if node 34 in the strobe cell of FIG. 8 is low, then the circuit will operate in the Harris configuration, and if the node 34 in the strobe cell is high, then the circuit will operate in the Smith configuration.

Referring again briefly to the strobe cell in FIG. 8, the nodes 33A and 33B therein are connected, respectively, to the nodes indicated at 33 in each separate but identical TTL output stage of the type shown in FIG. 9. If node 34 in FIG. 8 is grounded, then these nodes 33A and 33B in FIG. 8 will be active and thereby actively interfacing with the TTL output stages to implement the strobe disabling function. Transistor Y9 in FIG. 8 will be conducting to disable Y7A and Y7B, and nodes 39A and 39B will be floating and will not affect the operation of Z8A in FIG. 9. There are two operational scenarios with node 34 grounded. This first scenario is when the strobe circuit pin 25 is held to TTL high to allow normal receiver operation, and the second operational scenario is when the strobe pin 25 is held to TTL low to disable the receiver outputs to TTL low. When the strobe pin 25 is held to TTL high, Y15 turns off and allows the base of Y12 to be pulled high through R52. With Y12 conducting, the bases of Y13A and Y13B are forced high. This action disables Y13A and Y13B and allows nodes 33A and 33B to float high. With the corresponding node 33 in FIG. 9 now floating, the TTL output circuitry will allow normal operation and normal signal translation through the receiver section of the transceiver.

When the strobe pin 25 is now switched to TTL low, Y15 turns on and pulls the emitter of Y15 low. This action in turn pulls the base of Y12 low and thereby turns off Y12. With Y12 now off, the emitter of Y12 and the bases of Y13A and Y13B are pulled low through R7A to the grounded node 34. This action turns on Y13A and Y13B and thereby pulls the nodes 33A and 33B low. When the corresponding node 33 in FIG. 9 is pulled low, it forces 29A and 29B in FIG. 9 to be turned off and thereby causes the output node 35 in FIG. 9 to be at TTL low (as described below) regardless of what signal is present on the base of Z13. Therefore, the receiver will be disabled with both the receiver outputs now low. On the other hand, if you take node 34 in FIG. 8 high, then transistors Y13A and Y13B are forced off because their bases are pulled high. This causes the emitters of Y13A and Y13B to float, and they will not affect the operation of Z29A and Z29B in FIG. 9. During this time, transistors Y7A and Y7B will be the vehicles for taking the strobe information to the TTL output stage in FIG. 9, and these transistors Y7A and Y7B operate in response to the voltages at 39A and 39B in FIG. 8 as previously described.

Again, there are two scenarios of operation with node 34 in FIG. 8 now connected to +5 volts: The first scenario is when the strobe pin 25 in FIG. 8 is held to TTL high to allow the receiver to operate normally, and the second scenario is when the pin 25 is held to TTL low to disable the receiver and force the receiver outputs to TTL high. When the strobe pin 25 is held to TTL high, Y15 is turned off and this action allows the base of Y8 to be pulled high through R52. With the base of Y8 high, Y8 conducts and pulls the collector of Y8 low and also pulls the bases of Y7A and Y7B low. This switching action turns off Y7A and Y7B, thereby allowing the emitters (nodes 39A and 39B in FIG. 8) of Y7A and Y7B to float high. With node 39 in FIG. 9 now floating, the TTL output circuitry therein will now allow normal operation and normal signal translation through the receiver portion of the transceiver.

When the strobe pin 25 is now held to TTL low, Y15 is turned on and pulls the emitter of Y15 low, thereby pulling the base of Y8 low and turning off Y8. With Y8 non-conducting, the collector of Y8 and the bases of Y7A and Y7B are pulled high through R52. This switching action in turn switches on Y7A and Y7B, simultaneously pulling their emitters high and pulling node 39 high. When node 39 in FIG. 9 is pulled high, it forces Z8B to turn off, and the output node 35 in FIG. 9 is forced to TTL high (as described below) regardless of what signal is present at the base of Z13. Therefore, the receiver is now disabled with both receiver outputs high.

Referring again to FIG. 8, it will be recalled that nodes 24A and 24B at the emitter of Y5 are sitting at 1.5 $V_{BE}$ below the voltage at reference node 15 at the base of Y1A. It will also be recalled that the signal swing out of node 31 of the window comparator 116 in FIG. 7 will also be the voltage at node 15 down to one $V_{BE}$ below the voltage at node 15. Now, in FIG. 9 if you go down a $V_{BE}$ through Z13B and then back up a $V_{BE}$ through Z8B, then this makes the signal at the emitter of Z8B swing from the voltage at node 15 to one $V_{BE}$ below the voltage at node 15. Now, with the voltage at node 24 at the base of Z12A being held at 1.5 $V_{BE}$ below the voltage at node 15, then the voltage at the emitter of Z12A will be at 0.5 $V_{BE}$ below the voltage at node 15, which is exactly in the middle of the TTL signal swing at node 31 into the base of Z13. Therefore, in FIG. 9 when you tie the emitters of Z8B and Z12A together, then Z8B will turn off when the voltage at node 39 floats high, simultaneously turning on Z12A. In other words, transistors Z8B and Z12A operate as a differentially coupled transistor pair.

Thus, when you pull up on the base of node 31 which pulls up on the base of Z8B, then you turn off Z8B, and the current from R87 now flows through Z12A, thereby causing the collector current from Z12A and passing through the resistors R88 and R89 to pull up on the voltage at the bases of Z9A and Z9B. This action in turn turns on Z9B, thereby causing the current from Z9A to pull down on the bases of Z1 and Z3 by conducting current through resistor R56 and into the collector of transistor Z2. This causes transistor Z9A to act as a Baker clamp, and the collector current flowing out of the collector of Z12 at this time pulls up on the base of Z9B, simultaneously developing one $V_{BE}$ across resistor R89. Since resistor R88 is two times the resistance of R89, then there is a voltage drop of 2 $V_{BE}$ across R88. This condition pulls the voltage at node 33 up to 3 $V_{BE}$. With the base of Z9A now being held at 3 $V_{BE}$, you go down 1 $V_{BE}$ across the base emitter junction of Z9A, so that there is now 2 $V_{BE}$ across Z9B, thus causing Z9B to clamp at 2 $V_{BE}$. The purpose of this clamping action of Z9B is to prevent any of the transistors shown in FIG. 9 from going into saturation. This is necessary because we do not have available to us a Schottky process available in the bipolar fabrication processes used in the construction of the above described monolithic integrated circuits. This clamping action keeps Z9B from going into saturation, and it also determines how much current Z9B will conduct. This circuitry represents yet another novel feature of the present invention.

Now, if at this time the voltage at node 31 at the base of Z13 falls, Z8B will now pull down on the emitter of Z12A and this switching action will turn Z12A off. Under these circumstances, the voltages across R88 and R89 fall to thereby cause Z9B to turn off. This action in turn causes the collector of transistor Z9B to rise, simultaneously pulling up on the bases of Z1 and Z3. Therefore, the above TTL output circuit in FIG. 9 has been interfaced with the voltages at nodes 31 and 32 in the window comparator stage 116 of FIG. 7 and has level translated these voltages through the above described operation of Z13, Z8B, and Z12A. In addition, the Baker clamp comprised of Z9A and Z9B and has also referenced the signal swing in the TTL output stage and at node 35 in FIG. 9 to ground potential.

Now, assume for the moment that the NPN transistor Z9B is turned off, with node 31 being low. At this time, the load resistor R56 will pull up on the bases of Z1 and Z3 in the TTL output circuit. Now, when you develop enough voltage down through the $V_{BE}$ of Z1 and through the voltage divider R91 and R92, the rise in voltage at the base of Z2 will eventually turn Z2 on. However, when Z2 turns on, it draws it collector current through the load resistor R56, and this again starts to pull down on the bases of Z1 and Z3. This operation is equivalent to a negative feedback circuit connected at the bases of Z1 and Z3, and this action in turn sets up a bias on the base of Z2 so that the current through Z2 is a function of the five volt supply minus the voltage on the base of Z1 divided by R56. This value of circuit voltage sets the current flowing through Z2, and this current is in turn multiplied by a factor of 2 into NPN transistor Z4, and by a factor of 6 into transistor Z6. The 50 ohm resistor R96 connected as shown between the base of Z4 and the base of Z6 is insufficient to debias the base of Z6, and the small voltage drop across R96 can be ignored in our present analysis. The small series resistor R96 is connected as shown so as to prevent Z6 from being pulled down far enough to this transistor Z6 go into saturation. Thus, when the base of Z1 is allowed to go high, this action turns on Z2, Z4, and Z6 to render these devices Z2, Z4, and Z6 constant active current sources for the TTL output stage.

The voltage on the base of Z1 is determined by the voltage on the base of Z2 and developed across R92 multiplied then by 1½ times because of the ratio of resistors R91 to R92. Thus, with a $V_{BE}$ drop across R92, there is a 0.5 $V_{BE}$ drop across R91, thereby placing 1.5 $V_{BE}$ at the emitter of Z1. This in turn places 2.5 $V_{BE}$ at the bases of Z1 and Z3. This 2.5 $V_{BE}$ at the base of Z3 translates down into 1.5 $V_{BE}$ at the emitter of Z3, which in turn means that you only have 0.5 $V_{BE}$ at the emitter of Z5 at the TTL output terminal 35. At this point, the output in FIG. 9 is low at the output terminal 35. But at this point Z5 is also clamped from going into hard saturation because Z5 will hold the collector of Z6 at 0.5 $V_{BE}$. This voltage of 0.5 $V_{BE}$ at the emitter of Z5 is enough voltage to get below the minimum TTL output level required of node 35 for a valid low, while simultaneously being high enough at the collector of Z6 to keep Z6 from going into hard saturation. The reason, of course, that we want to maintain these transistors out of saturation is that the switching speeds of these transistors need to be extremely fast. Not having a Schottky process available to us, the present novel connection as shown in FIG. 9 is operative to bias these transistors into a non-saturating current mode switching operation. Since Schottky processes take a special metallization deposition which is not available in conventional bipolar processes, these Schottky clamping devices must be replaced using the above novel DC coupled level translation and clamping techniques described for the circuitry in FIG. 9, and in the previous circuits as well. These are yet further novel features of the present invention.

Referring again to the TTL output stage in FIG. 9, the pull up resistor R57 is the same value as the pull up resistor R59, so that with two times the current flowing into the collector of Z4 as that is flowing into the collector of Z2, this means that the excess current that Z4 wants to pull must now come out of the emitter of transistor Z3. This then completes the description of the low state of the TTL output stage in FIG. 9.

Now, the high state of the TTL output stage in FIG. 9 will be described, starting with the signal swing that takes node 31 at the base of Z13 high. Recall that this action will turn on Z9B by the current flowing out of Z12A. When Z9B turns on, it pulls down on what is effectively a 2 $V_{BE}$ level as previously described. That is, Z9B is clamped by the Baker clamping action of Z9A to 2 $V_{BE}$. Now, Z9B was previously sitting at the 2.5 $V_{BE}$ at the bases of Z1 and Z3, so that by Z9B pulling the collector of Z2 down by 0.5 $V_{BE}$, this 0.5 $V_{BE}$ change across Z2 is enough of a voltage change to cause transistors Z2, Z4, and Z6 to turn off. Thus, the signal swing at the collector of Z2 from 2.5 $V_{BE}$ to a 2.0 $V_{BE}$ is enough signal swing to cause Z2, Z4, and Z6 to turn off. By turning these devices Z2, Z4, and Z6 off, this switching action allows the base voltage of Z5 to rise, causing R57 to pull up on the base of Z5. This action in turn also pulls up on the emitter of Z5 at the output node 35 and drives the TTL output stage to its high output state. Thus, the TTL output node 35 is now resting at 0.5 $V_{BE}$ below the 5 volt supply which is far in excess of the voltage levels needed for a TTL compatible output signal. In addition, the output signal swing from a low of 0.5 $V_{BE}$ to 0.5 $V_{BE}$ below the 5 volt supply at the output node 35 is also compatible with CMOS signal swing requirements.

Thus, it is seen from the above description that the signal swing propagating throughout the above described circuits is not very large. That is, when the signal level is one $V_{BE}$ at node 31, it is only a 0.5 $V_{BE}$ at the bases of Z1 and Z3. Since this signal swing is quite small, this means that the node voltages within the above described circuitry do not have to ramp very far. Furthermore, since none of the transistors described are driven into saturation, you do not have to worry about stored charge, and the above combination of limiting the stored charge and limiting the signal swing allows the TTL output circuit as well as all of the preceding circuits to switch very fast. At the same time, there is enough gain in the circuit to get a full signal swing at the TTL output terminal 35 in FIG. 9 as described above. Here is yet another novel feature of the present invention.

Various modifications may be made in and to the above described embodiments without departing from the spirit and scope of this invention. For example, there are many circuit design changes and modifications available to the skilled circuit designer which may be used to change DC voltage thresholds, gain, and gain-versus-frequency roll-off and filtering characteristics in order to adapt the above circuitry to a specific transmitter, receiver, or transceiver application. In addition, such design changes and modifications may be associated with many different variations in the topographical layout for the monolithic die and related bipolar processing techniques used in the fabrication of the above circuits. Furthermore, if required for certain transceiver applications, additional "out-board" filter components and the like may be used to additionally tune the operational characteristics of the above-described transceiver. Accordingly, it will be understood that any and all of the above types of circuit design, layout and process modifications are clearly within the scope of the following appended claims.

We claim:

1. An integrated transmitter-receiver (transceiver) adapted for complete construction on a single semiconductor die and operative from a single 5 volt or equivalent DC supply voltage for providing a digital communication link between two or more computers, comprising:

a. a transmitter section having a low power transmission timer with a logic input stage therein for receiving bi-phase input digital data TX IN and $\overline{TX\ IN}$,
    b. first and second wave shaping stages connected to separate outputs of said logic input stage for controlling and being controlled by the rise and fall times of the output logic signals from said logic input stage and operative so that said first and second wave shaping stages conduct at mutually exclusive times, and
    c. first and second output current drivers connected, respectively, to the outputs of said first and second wave shaping stages and operative for connection to the primary winding of a transformer which is center tapped to ground potential, whereby each one-half of said primary winding of said transformer is completely turned off by one of said current drivers when the other one-half is conducting, thereby enhancing the power transfer characteristics and efficiency of said transmitter and eliminating current spiking and current drain in said transformer.

2. The transceiver defined in claim 1 which further includes a receiver section operatively associated with said transmitter section on a single semiconductor die and operative to receive and process bi-phase data RX IN and RX IN which is received from the transmitter section of a like transceiver, said receiver section comprising:

a. a differential input-differential output amplifier stage connected to receive said bi-phase data RX IN and $\overline{RX\ IN}$,
    b. a balanced differential filter stage connected to receive the differential output signal from said amplifier stage and having closely controlled thresholds and noise immunity characteristics which may be established using thin film resistors and MOS capacitors deposited on an external surface of said semiconductor die,
    c. a differential comparator stage connected to receive the differential output signal from said balanced differential filter stage and operative to generate bi-phase output signals when the signals received at said balanced differential filter stage exceed a certain threshold and fall within a prescribed filter bandwidth, and
    d. first and second output logic drivers connected, respectively, to first and second outputs of said differential comparator stage for generating RX DATA OUT and $\overline{RX\ DATA\ OUT}$ signals for use in controlling an associated computer.

3. The transceiver defined in claim 1 wherein said logic stage includes:

a. an EXCLUSIVE OR gate having first and second input terminals for receiving thereat TX IN and $\overline{TX\ IN}$ bi-phase input data and further having its output conductor connected as one input to a conventional OR gate, and
    b. in INHIBIT data line connected as a second input terminal to said conventional OR gate, whereby $\overline{TX\ IN}$ and TX IN data are applied directly to said first and second wave shaping stages, and the output signals from said conventional OR gate are also connected as input signals to said first and second wave shaping stages within said low power transmission timer.

4. The transceiver defined in claim 3 wherein said low power transmission timer further includes a wave shape interface stage connected to receive input signals from said conventional OR gate and further having first and second output data lines connected, respectively, to said first and second wave shaping stages for controlling the timing of said first and second wave shaping stages and ensuring that one of said wave shaping stages has been completely turned off before the other wave shaping stage turns on.

5. The transceiver defined in claim 4 wherein each of said output current drivers includes a plurality of parallel connected driver transistors connected to each of two primary windings of a center tapped output transformer, with all of said parallel connected transistors being operatively driven by a current source output terminal in each of said wave shaping stages, respectively, whereby said current driver transistors are operative to dynamically drive the two primary center tapped transformer windings out of phase and further wherein each transistor in each of said current driver output stages is completely turned off before transistors in the other current driver output stage are turned on.

6. The transceiver defined in claim 5 wherein each current source output terminal of each of said wave shaping stages is driven by a lateral PNP transistor having bias and control circuitry connected thereto for overdriving said lateral PNP transistor to rapidly turn it on and thereafter providing rapid base discharge to said lateral PNP transistor to rapidly turn off said lateral PNP transistor to thereby enhance the switching speed thereof and further to prevent said lateral PNP transistor from turning back on when said current source output terminal of each of said wave shaping stages is driven below ground potential.

7. The transceiver defined in claim 6 wherein said logic input stage includes:
    a. first and second data channels connected, respectively, to drive first and second output switching transistors, and
    b. first and second DC bias and current source strings interconnecting said first and second output switching transistors between a supply voltage terminal and a point of reference potential, said first and second DC bias and current source strings further having first and second output current source nodes therein so that said first and second output switching transistors are operative to alternately source current out of each of said output current source nodes to one of said first and second wave shaping stages when said switching transistor is turned off and operative to source current into said first and second output switching transistors when said output switching transistors are turned on, thereby dynamically driving said first and second output current source nodes in said DC bias and current source strings dynamically out of phase.

8. The transceiver defined in claim 7 wherein said wave shape interface stage further includes threshold level control and sync pulse timing circuitry useful as an interface circuit for controlling the timing of signals in said first and second wave shaping stages and including, in combination:
    a. an input voltage reference node referenced to the bandgap voltage of silicon,
    b. a DC bias and current source string connected between a low voltage supply terminal and a point of reference potential and being connected to said input voltage reference node, said DC bias and current source string further having a plurality of reference voltage junctions therein set at different pre-established DC bias voltage levels,
    c. first and second pairs of output transistors each connected between one of said reference voltage junctions on said DC bias and current source string and first and second wave shape driving nodes for generating thereat a ramp voltage having voltage swings between different levels controlled by the voltages at said reference voltage junctions, and
    d. an output reference voltage terminal connected to a different reference voltage junction in said DC bias and current source string and being operatively connectable to a threshold reference voltage device in each of said wave shaping stages, whereby the ramp voltage at each of said first and second wave shape driving nodes and applied, respectively, to each of said first and second wave shaping stages is operative to swing above and below said threshold reference voltage at said output reference voltage terminal and thereby in turn switch on and off an active data channel in each of said first and second wave shaping stages.

9. The transceiver defined in claim 8 which further includes a receiver section operatively associated with said transmitter section on a single semiconductor die and operative to receive and process bi-phase data which is received from the transmitter section of a like transceiver, said receiver section comprising:
    a. a differential input-differential output amplifier stage connected to receive said bi-phase data,
    b. a balanced differential filter stage connected to receive a differential output signal from said amplifier stage and having closely controlled thresholds and noise immunity characteristics which may be established using thin film resistors and MOS capacitors deposited on an external surface of said semiconductor die,
    c. a differential comparator stage connected to receive a differential output signal from said balanced differential filter stage and operative to generate bi-phase output signals when the signals received at said balance differential filter stage exceed a certain threshold and fall within a prescribed filter bandwidth, and
    d. first and second output logic drivers connected, respectively, to first and second outputs of said differential comparator stage for generating bi-phase output data signals for use in controlling an associated computer.

10. An all monolithic transceiver having a receiver section therein which includes:
    a. a differential input-differential output amplifier stage connected to receive said bi-phase data RX IN and $\overline{\text{RX IN}}$,
    b. a balanced differential filter stage connected to receive the differential output signal from said amplifier stage and having closely controlled thresholds and noise immunity characteristics which may be established using thin film resistors and MOS capacitors deposited on an external surface of said semiconductor die,
    c. a differential comparator stage connected to receive the differential output signal from said balanced differential filter stage and operative to generate bi-phase output signals when the signals received at said balanced differential filter stage exceed a certain threshold and fall within a prescribed filter bandwidth, and
    d. first and second output logic drivers connected, respectively, to first and second outputs of said differential comparator stage for generating RX DATA OUT and RS DATA OUT signals for use in controlling an associated computer.

11. Logic circuitry for operation in a transmitter section of an all monolithic transceiver which includes, in combination:

a. first and second data channels connected, respectively, to drive first and second output switching transistors, and b. first and second DC bias and current source strings interconnecting said first and second output switching transistors between a supply voltage terminal and a point of reference potential, said DC bias and current source strings further having first and second output current source nodes therein operative to alternatively source current out of each of said current source nodes to a wave shaping stage when a switching transistor connected thereto is turned off and further operative to source current into said switching transistor connected thereto when said switching transistor is turned on.

12. The logic circuitry defined in claim 11 which further includes means for biasing said first and second switching transistors at a voltage which is referenced to the bandgap voltage of silicon, thereby rendering said logic circuitry relatively insensitive to variations in temperature and voltage coefficients within said logic circuitry.

13. The logic circuitry defined in claim 11 which further includes an INHIBIT channel connected in parallel with said first and second data channels, said INHIBIT channel being further connected to both of said first and second output switching transistors and operative to turn off said first and second output switching transistors in response to INHIBIT signals applied to said INHIBIT channel.

14. The logic circuitry defined in claim 13 which further includes means for biasing said first and second switching transistors at a voltage referenced to the bandgap voltage of silicon, thereby rendering said logic circuitry relatively insensitive to variations in temperature and voltage coefficients with said logic circuitry.

15. Wave shaping circuitry useful in the connection and operation with bi-phase data channels of a transmitter section of a monolithic transceiver and operative to ensure that one of said data channels has been completely turned off before the other channel of the transmitter turns on, said wave shaping circuitry including, in combination:

a. a data channel and a voltage reference channel connected to receive digital data and a threshold reference voltage, respectively, for activating said data and voltage reference channel when said digital input data and said voltage reference levels exist at certain values, b. first and second lateral PNP output transistors connected to an output current source node for driving thereat a transceiver output stage when said first lateral PNP transistor is turned on and for turning off said output stage when said second lateral PNP output transistor is turned on and said first lateral PNP output transistor is turned off, and c. control circuit means connected to said first lateral PNP output transistor for overdriving said first lateral PNP output transistor and rapidly turning it on and thereafter rapidly removing base charge from said first lateral PNP output transistor to rapidly turn it off and ensure that neither of said first and second lateral PNP output transistors is turned back on when said output current source node goes below ground potential.

16. The wave shaping circuitry defined in claim 15 wherein said control circuit means includes a third lateral PNP transistor connected to said first lateral PNP output transistor, and a turn off drive transistor connected in parallel with both said first and third lateral PNP transistors and operative to turn off and rapidly discharge said first and third lateral PNP transistors when said wave shaping stage is being turned off.

17. The wave shaping circuitry defined in claim 15 which further includes:

a. differentially coupled transistor pairs connected to receive, respectively, reference voltage and digital input data applied to said wave shaping circuitry, and b. first and second cascaded transistors connected between one transistor in said differentially coupled transistor pairs and a load resistor which in turn is connected to a supply voltage terminal, said load impedance operative to turn on said first and second cascaded transistors when said transistor pairs are switched and generate a voltage, delta V, across said load resistor which in turn is mirrored at a load resistor for said first lateral output PNP transistor and is operative to rapidly turn off said first lateral output PNP transistor when said wave shaping circuitry is being turned off.

18. The wave shaping circuitry defined in claim 17 wherein said control circuit means includes a third lateral PNP transistor connected to said first lateral PNP output transistor, and a turn off drive transistor connected in parallel with both said first and third lateral PNP transistors and operative to turn off and rapidly discharge said first and third lateral PNP transistors when said wave shaping stage is being turned off.

19. The wave shaping circuitry defined in claim 18 wherein said reference voltage terminal is connected through an input buffer transistor to a first plurality of emitter coupled NPN transistors and said digital input data is applied through a second buffer transistor to a second plurality of NPN emitter coupled transistors, with said first and second pluralities of NPN emitter coupled transistors being differentially switched into and out of conduction to thereby alternately drive said first and second cascaded transistors to conduction and non-conduction and thereby provide rapid overdrive and turn on of said first lateral output PNP transistor when said wave shaping circuitry is sourcing current out of said output current source node thereof and rapidly turn off and discharge said first lateral output PNP transistor when said wave shaping circuitry is being turned off.

20. An output current driver circuit for a monolithic integrated transceiver and operative to drive an inductive load such as one-half of the primary winding of a center tapped transformer, including, in combination:

a. a plurality of matched transistors connected in parallel and further connected between an input current source node and one end of a coil, and b. bias circuitry connected to both the base and emitters of each of said plurality of matched transistors for controlling the DC operating bias on said plurality of matched transistors and setting the output current levels therefrom when each of said plurality of matched transistors is driven to conduction to provide output current to said coil.

21. The output current driver circuitry defined in claim 20 wherein each of said plurality of transistors is an NPN connected transistor, all having a common base input connection to a current source input node from a wave shaping stage.

22. The output current driver circuit defined in claim wherein said bias circuitry connected to said bases and emitters of each of said plurality of matched transistors includes:
 a. a first plurality of emitter resistors connected between the emitters, respectively, of said plurality of matched transistors and an output coil, and
 b. a plurality of base resistors connected, respectively, between each of the base connections for said plurality of matched transistors and the respective ends of each of said emitter resistors.

23. A threshold level control and sync pulse timing circuit useful as an interface stage for controlling timing in a connected wave shaping stage, including, in combination:
 a. an input reference voltage node referenced to the bandgap voltage of silicon,
 b. a DC bias and current source string connected between a low voltage supply terminal and a point of reference potential and also being connected to said input reference voltage node, said DC bias and current source string having a plurality of reference voltage junctions therein set at different preestablished DC bias voltage levels,
 c. first and second output transistor pairs connected between one of said reference voltage junctions on said DC bias and current source string and first and second output wave shape driving nodes for generating thereat ramp voltages having control voltage swings which are in turn controlled by the voltage levels at said reference voltage junctions, and
 d. an output reference voltage terminal connected to another different reference voltage junction in said DC bias and current source string and being operatively connectable to a threshold reference voltage device in a following wave shape stage, whereby said ramp voltage at each of said first and second wave shape driving nodes and applied, respectively, to each of first and second wave shaping stages is operative to swing above and below the threshold reference voltage at said output reference voltage terminal and in turn switch on and off an active data channel in each of said wave shaping stages.

24. The threshold level control and sync pulse timing circuitry defined in claim 23 wherein said DC bias and current source string includes:
 a. an input current source transistor connected to both a load impedance and to said input reference voltage node, and
 b. a plurality of resistors and temperature compensating base emitter junctions connected in series between said input current source transistor and a point of reference potential and defining said plurality of reference voltage junctions within said current source of string which are useful for controlling the voltage levels at said first and second output transistor pairs and the voltage level at said output reference voltage terminal.

25. The threshold level control and sync pulse timing circuitry defined in claim 24 wherein:
 a. said first and second wave shape driving nodes are connected, respectively, to output nodes of said first and second transistor pairs with each transistor in a transistor pair being alternately conductive to the exclusion of the other, and further with one transistor in each transistor pair being connected to a separate output wave shape control and timing voltage terminal which is also connected to drive a following wave shape stage, and
 b. offset voltage means connected between said last named terminal and one of said voltage reference junction in said DC bias and current source string for providing a small offset differential in voltage bias between that applied to transistors in said first and second transistor pairs and that generated out at said output voltage reference terminal to ensure a solid switching action in said following wave shape stage.

26. A DC coupled differential input/differential output monolithic receiver including, in combination:
 a. a differential input/differential output first or input stage having differentially coupled input transistors connected to drive output buffer transistors,
 b. a differential input/differential output second or intermediate filter stage having differentially coupled transistors connected to and driven by said output buffer transistors of said first stage and being further connected to differentially driven output buffer transistors, said second stage including a pair of balanced low pass filter networks connected between said buffer transistors in said input stage and said differentially coupled transistors in said filter stage and operative for establishing a predetermined gain versus frequency characteristic and roll-off out beyond a certain operating frequency, and
 c. a differential input/differential output third or output window comparator stage connected to said output buffer transistors in said intermediate filter stage, said output window comparator stage including a differentially coupled transistor pair connected to a pair of current source transistors, and a pair of differentially driven output nodes connected between said pair of current source transistors and said differentially coupled transistors in said window comparator stage, said pair of current source transistors being further connected through a pair of load resistors, respectively, to a voltage supply terminal and establishing a desired output current level in signal swing at said pair of differentially driven output terminals of said window comparator stage.

27. The receiver defined in claim 26 which further includes current source transistors connected between all of said differentially coupled transistors in each of said stages and a point of reference potential and further being connected to a common bias node which is reference to the bandgap voltage of silicon.

28. The receiver defined in claim 27 wherein said pair of current source transistors in said window comparator stage are connected to a reference voltage node referenced to the bandgap voltage of silicon, and
 b an additional pair of current source transistors connected to said differentially coupled transistors in said window comparator stage and optionally connected in parallel with existing current source transistors in said window comparator stage and further being connected to either ground potential so as to operate as active current sources or being allowed to float or connected to a positive DC supply voltage for being effectively removed from said window comparator stage, whereby said optional pair of current source transistors in said window comparator stage are operative to change the resting DC levels and polarities at said differentially connected output terminals in said window comparator stage.

29. The receiver defined in claim 28 which further includes a pair of additional, balanced low pass filter networks connected at the outputs of said buffer transistors in said differentially connected filter stage and operative to provide an additional pole of roll-off at higher frequencies for said gain versus frequency characteristic of said receiver.

30. The receiver defined in claim 29 wherein each of said differentially coupled transistor pairs in each of said input, intermediate filter and output window comparator stages includes a common emitter resistor connected therebetween in order to set the proper threshold levels in each of these three stages and further operative to enable said stages to handle both large signal and small signal swings during the processing therethrough of antenna signals coupled to said first amplifier stage.

31. The receiver defined in claim 30 which further includes a pair of clamping diodes connected between said differentially coupled input transistors in said first amplifier stage and a point of reference potential and operative for clamping said differentially coupled transistors in said first stage when they are overdriven during the operation of an associated transmitter connected to the same coil as said receiver.

32. The receiver defined in claim 30 which further includes a pair of resistor networks connected between said differentially coupled input transistors in said first stage and a pair of input terminals operative for connection to an antenna, said pair resistor networks each having therein an insertable resistor which may be added or removed from said resistor networks to change the impedance thereof and accommodate variations in levels of signals received from said antenna.

33. A high speed and efficient transistor/transistor logic (TTL) output stage for a receiver section of a monolithic transceiver and operative to be driven by differential output signals from a window comparator stage, including, in combination:
   a. input circuit means connectable to a pair of differential output nodes of said window comparator stage, and
   b. non-saturating TTL output circuit means connected between said input circuit means and a TTL output terminal, said output circuit means having complementary switched output transistor pairs therein connected in tandem and operative for driving said output terminal between first and second logical output levels.

34. The TTL output stage defined in claim 33 wherein said complementary switched output transistor pairs are operative to drive said TTL output terminal between one base-emitter voltage drop, $V_{BE}$, above ground and one $V_{BE}$ below a supply voltage for said output stage.

35. The TTL output stage defined in claim 33 wherein said output circuit means includes upper and lower complementary driven transistors within each of said transistor pairs and being alternately driven to conduction when the output logic swing at said output terminal is moving between two output logical levels.

36. The TTL output stage defined in claim 35 wherein said input circuit means is further connected to a reference voltage node which is referenced to the bandgap voltage of silicon and further includes in input NPN transistor connected to the output of said window comparator stage and an input PNP transistor connected to said reference voltage node.

37. The TTL output stage defined in claim 35 which further includes clamping circuit means connected between a strobe input terminal and said transistor pairs in said output circuit means and operative to disable said output circuit means upon receiving signals at a predetermined level from said strobe circuit means.

38. The TTL output stage defined in claim 37 wherein said input circuit means includes a first NPN input transistor connected to differential output nodes from said window comparator stage and a PNP input transistor connected to a reference voltage node referenced to the bandgap voltage of silicon, said input circuit means further including an enable/disable transistor being connected between said input PNP transistor and said clamping circuit means and further being operative to receive strobe signals to provide an additional degree of enabling and disabling capability for said TTL output stage by signals received from a strobe cell.

* * * * *

UNITED STATES PATENT AND TRADEMARK OFFICE
CERTIFICATE OF CORRECTION

PATENT NO. : 5,153,466

DATED : October 6, 1992

INVENTOR(S) : Marc T. Stein, and Lonny E. Stormo

It is certified that error appears in the above-indentified patent and that said Letters Patent is hereby corrected as shown below:

Abstract, Line 30, delete "TX DATA OUT", and insert in its place --$\overline{\text{RX DATA OUT}}$--.

Column 2, Line 59, delete "a 5 volt", and insert in its place --a 15 volt--.

Column 8, Line 39, delete "$\overline{\text{RX DATA OUT}}$", and insert in its place --$\overline{\text{RX DATA OUT}}$--.

Column 9, Line 27, delete "$\overline{\text{TX IN}}$", and insert in its place --TX IN--.

Column 9, Line 29, delete "TX IN", and insert in its place --$\overline{\text{TX IN}}$--.

Column 10, Line 18, delete "3A", and insert in its place --Q3A--.

Column 14, Line 36, delete "TX OUT", and insert in its place --$\overline{\text{TX OUT}}$--.

Column 24, Line 44, delete "stag 100", and insert in its place --stage 100--.

Column 28, Line 9, delete "$V_{BE}$Y1A", and insert in its place --$V_{BE}$ of Y1A--.

Column 36, Line 17, delete "RX IN", and insert in its place --$\overline{\text{RX IN}}$--.

Column 36, Line 40, delete "RX DATA OUT", and insert in its place --$\overline{\text{RX DATA OUT}}$--.

UNITED STATES PATENT AND TRADEMARK OFFICE
CERTIFICATE OF CORRECTION

PATENT NO. : 5,153,466
DATED : October 6, 1992
INVENTOR(S) : Marc T. Stein, and Lonny E. Stormo It is certified that error appears in the above-indentified patent and that said Letters Patent is hereby corrected as shown below:

Column 36, Line 46, delete "TX IN", and insert in its place --$\overline{\text{TX IN}}$--.

Column 36, Line 51, delete "$\overline{\text{TX IN}}$ and TX IN", and insert in its place --TX IN and $\overline{\text{TX IN}}$--.

Column 38, Line 63, delete "RS DATA OUT", and insert in its place --$\overline{\text{RX DATA OUT}}$--.

Column 41, Line 1, delete "claim", and insert in its place --claim 21--.

Signed and Sealed this

Twentieth Day of September, 1994

Attest:

BRUCE LEHMAN

Attesting Officer          Commissioner of Patents and Trademarks